(12) United States Patent
Kang et al.

(10) Patent No.: US 9,701,901 B2
(45) Date of Patent: *Jul. 11, 2017

(54) THIOL CONTAINING COMPOSITIONS FOR PREPARING A COMPOSITE, POLYMERIC COMPOSITES PREPARED THEREFROM, AND ARTICLES INCLUDING THE SAME

(71) Applicant: SAMSUNG ELECTRONICS CO., LTD., Suwon-si, Gyeonggi-Do (KR)

(72) Inventors: Hyun A Kang, Suwon-si (KR); Eun Joo Jang, Suwon-si (KR); Young Hwan Kim, Seongnam-si (KR); Shin Ae Jun, Seongnam-si (KR); Hyo Sook Jang, Yongin-si (KR)

(73) Assignee: SAMSUNG ELECTRONICS CO., LTD., Gyeonggi Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/184,011

(22) Filed: Jun. 16, 2016

(65) Prior Publication Data

US 2016/0289557 A1    Oct. 6, 2016

Related U.S. Application Data

(63) Continuation of application No. 14/664,339, filed on Mar. 20, 2015, now Pat. No. 9,382,470, which is a
(Continued)

(30) Foreign Application Priority Data

Jul. 1, 2010    (KR) ................. 10-2010-0063624

(51) Int. Cl.
  *C09K 11/88*    (2006.01)
  *C09K 11/70*    (2006.01)
(Continued)

(52) U.S. Cl.
  CPC .......... *C09K 11/883* (2013.01); *C08G 75/045* (2013.01); *C08L 81/02* (2013.01);
(Continued)

(58) Field of Classification Search
  None
  See application file for complete search history.

(56) References Cited

U.S. PATENT DOCUMENTS 3,976,553 A    8/1976  Larsen
5,585,035 A    12/1996 Nerad et al.
(Continued)

FOREIGN PATENT DOCUMENTS

JP    07165859 A    6/1995
JP    2002155141 A    5/2002
(Continued)

OTHER PUBLICATIONS

European Patent Application for European Patent Application No. 11801185.7 dated Nov. 3, 2016.
(Continued)

*Primary Examiner* — Joseph Schoenholtz
(74) *Attorney, Agent, or Firm* — Cantor Colburn LLP

(57) ABSTRACT

A composition comprising: a first monomer comprising at least three thiol groups, each located at a terminal end of the first monomer, wherein the first monomer is represented by the following Chemical Formula 1-1:

Chemical Formula 1-1

$$R_a\text{---}Y_a\diagdown\underset{L_1}{\phantom{X}}\diagup Y_b\text{---}R_b$$
$$R_c\text{---}Y_c\diagup\phantom{L_1}\diagdown Y_d\text{---}R_d$$

(Continued)

a second monomer comprising at least two unsaturated carbon-carbon bonds, each located at a terminal end of the second monomer, wherein the second monomer is represented by the following Chemical Formula 2:

Chemical Formula 2

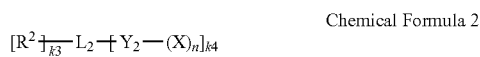

wherein in Chemical Formulae 1 and 2 groups $R^2$, $R_a$ to $R_d$, $Y_a$ to $Y_d$, $L_1'$ and $L_2$, X and variables k3 and k4 are the same as described in the specification, and a first light emitting particle, wherein the first light emitting particle consists of a semiconductor nanocrystal comprising a Group II-VI compound, a Group III-V compound, a Group IV-VI compound, or a combination thereof, wherein the first light emitting particle has a core/shell structure having a first semiconductor nanocrystal being surrounded by a second semiconductor nanocrystal, and the first semiconductor nanocrystal being different from the second semiconductor nanocrystal.

23 Claims, 11 Drawing Sheets

Related U.S. Application Data continuation-in-part of application No. 13/175,133, filed on Jul. 1, 2011.

(51) Int. Cl.

| | | |
|---|---|---|
| H01L 33/56 | (2010.01) |
| C08L 81/02 | (2006.01) |
| C08G 75/045 | (2016.01) |
| H01L 33/50 | (2010.01) |
| C09K 11/02 | (2006.01) |
| B82Y 20/00 | (2011.01) |
| B82Y 30/00 | (2011.01) |

(52) U.S. Cl.
CPC ............ *C09K 11/02* (2013.01); *C09K 11/703* (2013.01); *H01L 33/502* (2013.01); *H01L 33/56* (2013.01); *B82Y 20/00* (2013.01); *B82Y 30/00* (2013.01); *H01L 33/501* (2013.01); *H01L 2933/005* (2013.01); *H01L 2933/0033* (2013.01); *H01L 2933/0041* (2013.01)

(56) References Cited

U.S. PATENT DOCUMENTS

| | | | |
|---|---|---|---|
| 5,593,615 A | 1/1997 | Nerad et al. |
| 5,641,426 A | 6/1997 | Nerad et al. |
| 5,876,805 A | 3/1999 | Ostlie |
| 5,919,487 A | 7/1999 | Simonnet et al. |
| 5,977,276 A | 11/1999 | Toh et al. |
| 6,172,140 B1 | 1/2001 | Toh et al. |
| 6,251,303 B1 | 6/2001 | Bawendi et al. |
| 6,306,610 B1 | 10/2001 | Bawendi et al. |
| 6,313,251 B1 | 11/2001 | Toh et al. |
| 6,391,983 B1 | 5/2002 | Bateman et al. |
| 6,426,513 B1 | 7/2002 | Bawendi et al. |
| 6,605,691 B1 | 8/2003 | Gross et al. |
| 6,605,692 B1 | 8/2003 | Gross et al. |
| 6,645,569 B2 | 11/2003 | Cramer et al. |
| 6,809,165 B2 | 10/2004 | Christie et al. |
| 6,870,311 B2 | 3/2005 | Mueller et al. |
| 7,160,613 B2 | 1/2007 | Bawendi et al. |
| 7,371,804 B2 | 5/2008 | Jethmalani et al. |
| 7,553,925 B2 | 6/2009 | Bojkova |
| 7,692,373 B2 | 4/2010 | Bawendi et al. |
| 7,709,545 B2 | 5/2010 | Hoyle et al. |
| 7,821,719 B2 | 10/2010 | Jethmalani et al. |
| 7,888,399 B2 | 2/2011 | Miyata et al. |
| 7,927,515 B2 | 4/2011 | Jang et al. |
| 8,035,772 B2 | 10/2011 | Kim et al. |
| 8,105,507 B2 | 1/2012 | Jang et al. |
| 8,129,074 B2 | 3/2012 | Chen et al. |
| 8,436,964 B2 | 5/2013 | Kim et al. |
| 8,618,528 B2 | 12/2013 | Gillies et al. |
| 9,382,470 B2 * | 7/2016 | Kang .................... C09K 11/703 |
| 2003/0036620 A1* | 2/2003 | Kawanabe ............. C08G 18/10 528/44 |
| 2005/0031871 A1 | 2/2005 | Kinsho et al. |
| 2006/0003156 A1 | 1/2006 | Masutani et al. |
| 2006/0065989 A1 | 3/2006 | Druffel et al. |
| 2006/0127665 A1 | 6/2006 | Masutani et al. |
| 2006/0263593 A1 | 11/2006 | Aziz et al. |
| 2007/0114931 A1 | 5/2007 | Son et al. |
| 2007/0185261 A1 | 8/2007 | Lee et al. |
| 2008/0068723 A1 | 3/2008 | Jethmalani et al. |
| 2008/0152933 A1 | 6/2008 | Mizuno et al. |
| 2008/0173886 A1* | 7/2008 | Cheon .................... C09K 11/02 257/98 |
| 2008/0230750 A1 | 9/2008 | Gillies et al. |
| 2008/0252209 A1 | 10/2008 | Jang et al. |
| 2008/0268249 A1 | 10/2008 | Araki et al. |
| 2009/0001395 A1 | 1/2009 | Chung et al. |
| 2009/0050848 A1 | 2/2009 | Kim et al. |
| 2009/0073349 A1 | 3/2009 | Park et al. |
| 2009/0096136 A1 | 4/2009 | Hawker et al. |
| 2009/0096190 A1 | 4/2009 | Sharp |
| 2009/0121195 A1 | 5/2009 | Lee et al. |
| 2009/0180055 A1 | 7/2009 | Kim et al. |
| 2009/0230363 A1 | 9/2009 | Lee et al. |
| 2009/0253805 A1 | 10/2009 | Hoyle et al. |
| 2009/0264669 A1 | 10/2009 | Upshaw |
| 2009/0294742 A1 | 12/2009 | Jang et al. |
| 2010/0109025 A1 | 5/2010 | Bhat |
| 2010/0123155 A1 | 5/2010 | Pickett et al. |
| 2010/0137474 A1 | 6/2010 | Goh et al. |
| 2010/0208493 A1 | 8/2010 | Choi et al. |
| 2010/0244731 A1 | 9/2010 | Kaihotsu et al. |
| 2010/0291702 A1 | 11/2010 | Naasani |
| 2011/0006321 A1 | 1/2011 | Chang et al. |
| 2011/0068322 A1 | 3/2011 | Pickett et al. |
| 2011/0081538 A1 | 4/2011 | Linton et al. |
| 2012/0001217 A1 | 1/2012 | Kang et al. |
| 2012/0091406 A1 | 4/2012 | Jang et al. |
| 2012/0193605 A1 | 8/2012 | Gillies et al. |
| 2012/0293063 A1 | 11/2012 | Kang et al. |

FOREIGN PATENT DOCUMENTS

| | | |
|---|---|---|
| JP | 2004015063 A | 1/2004 |
| JP | 2008156390 | 7/2008 |
| JP | 2008156390 A | 7/2008 |
| JP | 2008244209 A | 10/2008 |
| KR | 1020060048512 A | 5/2006 |
| KR | 1020060120502 A | 11/2006 |
| KR | 100719580 B1 | 5/2007 |
| KR | 1020070076832 A | 7/2007 |
| KR | 1020090028928 | 3/2009 |
| KR | 1020090049736 A | 5/2009 |
| KR | 1020090078547 | 7/2009 |
| KR | 1020090124550 | 12/2009 |
| KR | 1020100089606 A | 8/2010 |
| KR | 1020100094194 A | 8/2010 |
| KR | 1020110033254 A | 3/2011 |
| WO | 0068297 | 11/2000 |
| WO | 0068297 A1 | 11/2000 |
| WO | 2008116079 A1 | 9/2008 |
| WO | 2010002562 A1 | 1/2010 |

OTHER PUBLICATIONS

"Clear Plastic Supplies" Acrylic PMMA Material Specification, downloaded from URL < http://www.clearplasticsupplies.co.uk/material.htm> on Dec. 13, 2012.

(56) References Cited

OTHER PUBLICATIONS

"Polyacrylic Acid", downloaded from URL < http://dtcl.guidechem.com/pro-show1999620.html > on Oct. 31, 2013.
The mid-power LED lighting trend: Q:A with Philips Lumileds CEO, downloaded from URL <http://www.digitimes.com/news/a20130909PD201.html > on Sep. 13, 2013.
3-aminopropylmethyl bis-(trimethyl siloxy) silane downloaded from URL<http://www.signaaldrich.com/catalog/product/aldrich/371890?lang=en®ion+US > Dec. 8, 2014.
Andrew B. Lowe, "Thiol-ene "click" reactions and recent applications in polymer and materials synthesis", Polymer Chemistry, vol. 1, 2010, pp. 17-36.
Bhargava, R.N. et al., "Optical Properties of Manganese-Doped Nanocrystals of ZnS," Physical Review Letters, vol. 72, No. 3, Jan. 17, 1994, pp. 416-419.
C. Hoyle et al., "Thiol-click chemistry: a multifaceted toolbox for small molecule and polymer synthesis," Chemical Society Reviews, 2010, pp. 1355-1387, vol. 39, No. 4.
Chang et al., "Light Emitting diodes Reliability Review", Microelectronics Reliability, vol. 525, 2012, pp. 762-782.
Chen et al., "Surface Modification of CdSe and CdS Quantum dots—Experimental and Density Function Theory Investigation" Intech 2012, p. 149-168.
Chin, Lim Wei et al., "Thermo-mechanical and Light Transmittance of Silica Diffusant Filled Epoxy Composites," Journal of Physical Science, vol. 21, No. 1, 2010, pp. 93-107.
Chiou, Bor-Sen et al., "Effect of Colloidal Fillers on the Cross-Linking of a UV-Curable Polymer: Gel Point Rheology and the Winter-Chambon Criterion," Macromolecules, vol. 34, No. 13, 2001, pp. 4526-4533.
Clear Plastic Supplies, downloaded from URL <http://www.clearplasticsupplied.co.uk/material.htm> on Dec. 13, 2012.
Clinton, Jamie C., "Colloidal Cerium Oxide Nanoparticles: Synthesis and Characterization Techniques," Diss. Virginia Polytechnic Institute and State University, Jan. 26, 2008, Blacksburg: Department of Electrical Science and Engineering, 2008, 89 page.
Definition of antioxidant downloaded from URL<http://www.merriam-webster.com/dictionary/antioxidant> on Oct. 1, 2015.
Dollefeld et al., "Investigations on the Stability of Thiol Stabilized Semiconductor Nanoparticles" Physical Chemistry Chemical Physics, vol. 4, 2002, pp. 4747-4753.
Efros, A. "Auger Processes in Nanosize Semidonductor Crystals", Naval Research Laboratory, Apr. 11, 2002, pp. 1-31, Figs. 1-15.
Fu, Shao-Yun "Multifunctional Transparent Epoxy Nanocomposites as Encapsulating Materials for LED Devices," Multifunctional Nanocomposites. Proc. of ICCM17, Edinburgh. Edinburgh: ICCM.org., 2009, pp. 1-9.
Gaponik, N., "Assemblies of thiol-capped nanocrystals as functional units for use in nanotechnology" University of Dresden, diss. Dec. 2011.
Gaponik, Nikolai "Asssemblies of thiol-capped Nanocrystals as Building Blocks for Use in nanotechtechnology", Journal of Materials chemistry, vol. 20., No. 25, 2010, pp. 5174-5181.
Ghosh, R., et al., "Core/Shell Nanoparticles: Classes, Properties, Synthesis Mechanisms Characterization, and Applications," Chem. Rev. 2012, 112, pp. 2373-2433.
H. Zhang et al., "Electrospinning Preparation and Luminescence Properties of Europium Complex/Polymer Composite Fibers," J. Phys. Chem. C, 2008, pp. 9155-9162, vol. 112, No. 25.
Hoyle et al., "Thiol-Ene Click Chemistry**", Angew. Chem. Int. Ed., 49, 2010, pp. 1540-1573.
Hoyle et al., Thiol-Enes: Chemistry of the Past with Promise for the Future Journal of Polymer Science: part A: Polymer Chemistry, vol. 42, 2004, pp. 5301-5338.
Innovation Plastics, Oxygen and Water Permeability, SABIC, 2013, pp. 1-3.
J. Liu et al., Nanoparticle Dispersion and Aggregation in Polymer Nanocomposites: Insights from Molecular Dynamics Simulation, 2011 American Chemical Society, Langmuir 2011, 27, pp. 7926-7933.
J. Ziegler et al., Silica-Coated InP/ZnS Nanocrystals as Converter Material in White LEDs, Advanced Materials 20.21 (2008): pp. 4068-4073.
Jeong et al., "Effect of the Thiol-Thiolate Equilibrium on the Photophysical Properties of Aqueous CdSe/ZnS nanocrystal Quantum dots." Journal of the American Chemical Society, vol. 127., No. 29, 2005, pp. 10126-10127.
Kade, M. et al., "The Power of Thiol-ene Chemistry," Journal of Polymer Science Part A: Polymer Chemistry, vol. 48, No. 4, 2010, pp. 743-750.
Kim et al. "Reverse Type-I ZnSe/Inp/ZnS Core/Shell/Shell Nanocrystals: Cadmium-Free Quantum Dots for Visible Luminescence"; Samsung Adv. Inst. of Tech.; 5 pages.
R. N. Bhargava et al., "Optical Properties of Manganese-Doped Nanocrystals of ZnS," Physical Review Letters, Jan. 17, 1994, pp. 416-419, vol. 72, No. 3.
Konishi, M. et al., "Enhancement of photoluminescence of ZnS:Mn nanocrystals by hybridizing with polymerized acrylic acid," Journal of Luminescence, vol. 93, Issue 1, May 2001, pp. 1-8.
Krongauz, V. et al., "Revisiting aromatic thiols effects on radical photopolymerization," Polymer, vol. 44, No. 14, 2003, pp. 3871-3876.
Kubo, T. et al., "Enhancement of photoluminescence of ZnS:Mn nanocrystals modified by surfactants with phosphate or carboxyl groups via a reverse micelle method," Journal of Luminescence, vol. 99, Issue 1, Aug. 2002, pp. 39-45.
Lim et al., "InP@ZnSeS, Core@Composition Gradient Shell Quantum Dots with Enhanced Stability", Chemistry of Materials, vol. 23, 23011, pp. 4459-4463.
Lin, Yuan-Chang et al., "LED and Optical Device Packaging and Materials," Chapter 18, Materials for Advanced Packaging, New York, Springer, 2008, pp. 629-680.
Lowe, Andrew B., "Thiol-one"click" Reactions and Recent Applications in Polymer and Materials Synthesis", Polymer Chemistry 1.1 (2010): 17.
Lu et al., "Chapter 18", Materials for Advanced Packing, New York; Springer, 2008, pp. 629-680.
Q:A with Philips Lumileds CEO, downloaded from URL<http://www.digitimes.com/news/a20130909PD201.html>onSep. 13, 2013.
Pich et al, "Nano-and Microgels through Addition Reactions of Functional Oligomeers and Polymers", Chemical Design of Responsive Microgels, vol. 234, Heidelberg: Springer, 2010, pp. 65-93.
M. Nyman et al., "Nano-YAG:Ce Mechanisms of Growth and Epoxy-Encapsulation," Chemistry of Materials, 2009, pp. 1536-1542, vol. 21, No. 8.
M.E. Mackay, "General Strategies for Nanoparticle Dispersion", Science, vol. 311.5768, Mar. 24, 2006, pp. 1740-1743.
Mather et al., "Michael Addition Reactions in Macromolecular Design for Emerging Technologies", Progress in Polymer Science, vol. 31., 2006, pp. 487-531.
N. Narendran et al., "Extracting phosphor-scattered photons to improve white LED efficiency," Physica Status Solidi (a), 2005, pp. R60-R62, vol. 202, No. 6.
Nason, C., et al., "UV Induced Frontal Polymerization of Multifunctional (Meth) Acrylates", Macromolecules, 38 pp. 550605512 (2005).
Nyman, May et al., "Nano-YAG:Ce Mechanisms of Growth and Epoxy-Encapsulation," Chemistry of Materials, 2009, vol. 21, No. 8, pp. 1536-1542.
Oxidation Induction Time Measurements by DSC, Hitachi High-Tech Science Corporation, TA, No. 49, Oct. 1988, pp. 1-3.
Pakeva, S. and Dafinova, A., Phys. Stat. Sol. (a), 106, K97-K100 (1988).
Shao-Yun Fu, "Multifunctional Transparent Epoxy Nanocomposites as Encapsulating Materials for LED Devices," Multifunctional Nanocomposites. Proc. of ICCM17, Edinburgh. Edinburgh: ICCM.org., 2009, pp. 1-9.
Shavel, Alexey, Nikolai Gaponik, and Alexander Eychmuller. "Factors Govering the Quality of Aqueous CdTe Nanocrystals: Calculations and Experiment."The Journal of Physical Chemistry B110. 39(2006)L 19280-9284.

(56) References Cited

OTHER PUBLICATIONS

Silicone for potting, encapsulation and bonding LED's downloaded from URL<http://www.acc-silicones.com/applications/leds.ashx> Dec. 4, 2014.

* cited by examiner

THIOL CONTAINING COMPOSITIONS FOR PREPARING A COMPOSITE, POLYMERIC COMPOSITES PREPARED THEREFROM, AND ARTICLES INCLUDING THE SAME

CROSS-REFERENCE TO RELATED APPLICATION

This application is a continuation application of U.S. patent application Ser. No. 14/664,339, filed on Mar. 20, 2015, and issued as U.S. Pat. No. 9,382,470, and which is a continuation in part application of U.S. patent application Ser. No. 13/175,133, filed Jul. 1, 2011, which claims priority to Korean Patent Application No. 10-2010-0063624, filed on Jul. 1, 2010 and all the benefits accruing therefrom under 35 U.S.C. §119, the content of which in its entirety, is herein incorporated by reference.

BACKGROUND

1. Field

This disclosure relates to a composition useful for preparing a composite, a polymeric composite including a polymerization product of the composition, and articles including the polymer composite.

2. Description of the Related Art

Semiconductor nanocrystals, which are also called quantum dots, are a semiconductor material with a nano-sized and crystalline structure, and include hundreds to thousands of atoms.

Since the semiconductor nanocrystals are very small, they have a large surface area per unit volume, and also have a quantum confinement effect. Accordingly, they have unique physicochemical characteristics that differ from the inherent characteristics of a corresponding bulk semiconductor material.

In particular, since optoelectronic properties of nanocrystals may be controlled by adjusting their size, the semiconductor nanocrystals are being actively researched and applied to display devices and biotechnology applications.

Moreover, since the semiconductor nanocrystal does not contain a heavy metal, it has a variety of advantages in that it is environment-friendly and safe for a human body. Therefore, there has been much research on development of a variety of technologies for synthesizing semiconductor nanocrystals having such excellent characteristics and applicability to diverse areas by controlling the size, structure, uniformity, and so forth of the semiconductor nanocrystals.

However, there remains a need for semiconductor nanocrystals having improved properties, such as improved stability, luminous efficacy, color purity, or lifetime, in order to more easily apply the semiconductor nanocrystals to a display device.

SUMMARY

An embodiment of this disclosure provides a composition for a light emitting particle-polymer composite and light emitting particle-polymer composite having excellent stability, and being capable of improving device efficiency and lifetime.

Another embodiment of this disclosure provides a device including the light emitting particle-polymer composite.

According to an embodiment of this disclosure, disclosed is a composition for a light emitting particle-polymer composite, the composition including a light emitting particle; a first monomer including at least two thiol groups, each located at a terminal end of the first monomer; and a second monomer including at least two unsaturated carbon-carbon bonds, each located at a terminal end of the second monomer.

According to another embodiment of this disclosure, disclosed is a light emitting particle-polymer composite including a light emitting particle; and a polymer including a polymerization product of a first monomer including at least two thiol groups, each located at a terminal end of the first monomer, and a second monomer including at least two unsaturated carbon-carbon bonds, each located at a terminal end.

The light emitting particle may include a nanocrystal, a phosphor, a pigment, or a combination thereof. The nanocrystal may include a semiconductor nanocrystal, a metal nanocrystal, a metal oxide nanocrystal, or a combination thereof.

The first monomer including at least two thiol (—SH) groups located at a terminal end of the first monomer may be represented by the following Chemical Formula 1.

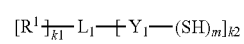

Chemical Formula 1

In Chemical Formula 1, $R^1$ is hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic group including a ring having a double bond or a triple bond in the ring, a substituted or unsubstituted C3 to C30 heterocycloalkyl group including a ring having a double bond or a triple bond in the ring, a C3 to C30 alicyclic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group, —NH$_2$, a substituted or unsubstituted C1 to C30 amine group of formula —NRR' wherein R and R' are each independently hydrogen or a C1 to C30 alkyl group, an isocyanate group, an isocyanurate group, a (meth)acrylate group, a halogen, —ROR' wherein R is a substituted or unsubstituted C1 to C20 alkylene group and R' is hydrogen or a C1 to C20 alkyl group, an acyl halide of formula —RC(O)X wherein R is a substituted or unsubstituted alkylene group and X is a halogen, —C(=O)OR' wherein R' is hydrogen or a C1 to C20 alkyl group, —CN, or —C(=O)ONRR' wherein R and R' are each independently hydrogen or a C1 to C20 alkyl group;

$L_1$ is a single bond, a substituted or unsubstituted C1 to C30 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group;

$Y_1$ is a single bond, a substituted or unsubstituted C1 to C30 alkylene group, or a substituted or unsubstituted C2 to C30 alkenylene group; or a C1 to C30 alkylene group or a C2 to C30 alkenylene group wherein at least one methylene group is replaced by a sulfonyl (—SO$_2$—), a carbonyl (—C(=O)—), an ether (—O—), a sulfide (—S—), a sulfoxide (—SO—), an ester (—C(=O)O—), an amide of formula —C(=O)NR— wherein R is hydrogen or a C1 to C10 alkyl group, an imine of formula —NR— wherein R is hydrogen or a C1 to C10 alkyl group, or a combination thereof;

m is an integer of 1 or more;
k1 is an integer of 0 or 1 or more;
k2 is an integer of 1 or more;
the sum of m and k2 is an integer of 3 or more;
m does not exceed the valance of $Y_1$; and
k1 and k2 does not exceed the valence of the $L_1$.

The second monomer may be represented by the following Chemical Formula 2.

Chemical Formula 2

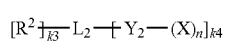

In Chemical Formula 2,

X is a C1 to C30 aliphatic organic group including an unsaturated carbon-carbon bond, a C6 to C30 aromatic organic group including an unsaturated carbon-carbon bond, or a C3 to C30 alicyclic organic group including an unsaturated carbon-carbon bond;

$R^2$ is hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C2 to C30 alkenyl group, a C2 to C30 alkynyl group, a substituted or unsubstituted C3 to C30 alicyclic group including a ring having a double bond or a triple bond in the ring, a substituted or unsubstituted C3 to C30 heterocycloalkyl group including a ring having double bond or a triple bond in the ring, a C3 to C30 alicyclic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxy group, —$NH_2$, a substituted or unsubstituted C1 to C30 amine group of formula —NRR' wherein R and R' are each independently hydrogen or a C1 to C30 alkyl group, an isocyanate group, an isocyanurate group, a (meth)acrylate group, a halogen, —ROR' wherein R is a substituted or unsubstituted C1 to C20 alkylene group and R' is hydrogen or a C1 to C20 alkyl group, an acyl halide of formula —RC(O)X wherein R is a substituted or unsubstituted alkylene group and X is a halogen, —C(=O)OR' wherein R' is hydrogen or a C1 to C20 alkyl group, —CN, or —C(=O)ONRR' wherein R and R' are each independently hydrogen or a C1 to C20 alkyl group;

$L_2$ is a single bond, a substituted or unsubstituted C1 to C30 alkylene group, a substituted or unsubstituted C6 to C30 arylene group, or a substituted or unsubstituted C3 to C30 heteroarylene group;

$Y_2$ is a single bond, a substituted or unsubstituted C1 to C30 alkylene group, or a substituted or unsubstituted C2 to C30 alkenylene group; or a C1 to C30 alkylene group or a C2 to C30 alkenylene group wherein at least one methylene group is replaced by a sulfonyl (—$SO_2$—), a carbonyl (—C(=O)—), an ether (—O—), a sulfide (—S—), a sulfoxide (—SO—), an ester (—C(=O)O—), an amide of formula —C(=O)NR— wherein R is hydrogen or a C1 to C10 alkyl group, an imine of formula —NR— wherein R is hydrogen or a C1 to C10 alkyl group, or a combination thereof;

n is an integer of 1 or more;
k3 is an integer of 0 or 1 or more;
k4 is an integer of 1 or more;
the sum of n and k4 is an integer of 3 or more;
n does not exceed the valance of $Y_2$; and
k3 and k4 does not exceed the valence of the $L_2$.

The first monomer of the above Chemical Formula 1 includes a monomer of the following Chemical Formula 1-1.

Chemical Formula 1-1

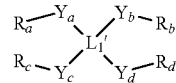

In Chemical Formula 1-1, $L_1'$ is carbon, a substituted or unsubstituted C6 to C30 arylene group, a substituted or a unsubstituted C6 to C30 heteroarylene group, a substituted or unsubstituted C3 to C30 cycloalkylene group, or a substituted or unsubstituted C3 to C30 heterocycloalkylene group;

each of $Y_a$ to $Y_d$ is independently a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by sulfonyl (—S(=O)$_2$—), carbonyl (—C(=O)—), ether (—O—), sulfide (—S—), sulfoxide (—S(=O)—), ester (—C(=O)O—), amide of formula —C(=O)NR— wherein R is hydrogen or a C1 to C10 alkyl group, an imine of formula —NR— wherein R is hydrogen or a C1 to C10 alkyl group, or a combination thereof; and $R_a$ to $R_d$ are $R^1$ of Chemical Formula 1 or —SH, provided that at least two of $R_a$ to $R_d$ are —SH.

In an embodiment, $L_1'$ may be a substituted or unsubstituted phenylene group.

Examples of the first monomer of the above Chemical Formula 1 include the compounds represented by the following Chemical Formulas 1-2 to 1-5.

Chemical Formula 1-2

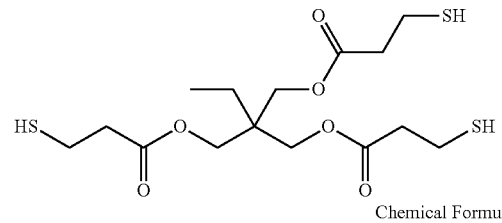

Chemical Formula 1-3

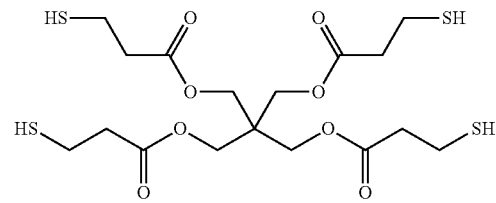

Chemical Formula 1-4

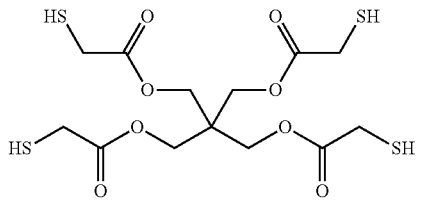

Chemical Formula 1-5

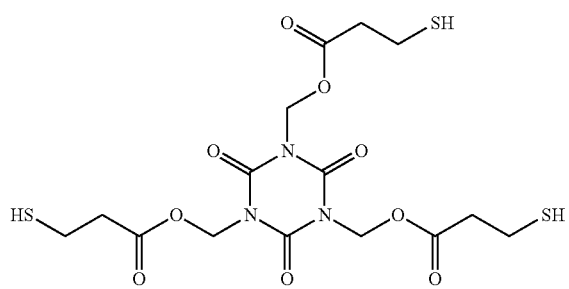

In an embodiment, X may be an acrylate group, a methacrylate group, a C2 to C30 alkenyl group, a C2 to C30 alkynyl group, a substituted or unsubstituted C3 to C30 alicyclic group including a ring having double bond or a triple bond in the ring, a substituted or unsubstituted C3 to C30 heterocycloalkyl group including a ring having double bond or a triple bond in the ring, a C3 to C30 alicyclic group substituted with a C2 to C30 alkenyl group or a C2 to C30 alkynyl group, or a C3 to C30 heterocycloalkyl group substituted with a C2 to C30 alkenyl group or a C2 to C30 alkynyl group.

In Chemical Formula 2, X may be a vinyl group or an allyl group. Also, the substituted or unsubstituted C3 to C30 alicyclic group including the ring having double bond or a triple bond in the ring may be a norbornene group, a maleimide group, a nadimide group, a tetrahydrophthalimide group, or a combination thereof.

In Chemical Formula 2, $L_2$ may be a pyrrolidine group, a tetrahydrofuran group, a pyridine group, a pyrimidine group, a piperidine group, a triazine group, or an isocyanurate group.

Examples of the second monomer of the above Chemical Formula 2 may include the compounds of the following Chemical Formulae 2-1 and Chemical Formula 2-2.

Chemical Formula 2-1

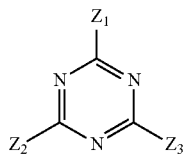

Chemical Formula 2-2

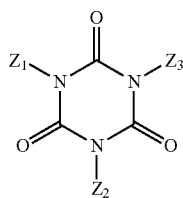

In Chemical Formulas 2-1 and 2-2, $Z_1$ to $Z_3$ are the same or different, and correspond to —[$Y_2$—$X_n$] of Chemical Formula 2.

Examples of the second monomer may include compounds of the following Chemical Formulas 2-3 to 2-5.

Chemical Formula 2-3

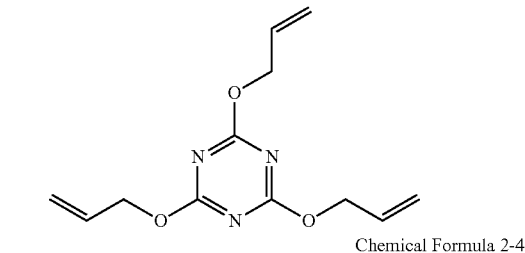

Chemical Formula 2-4

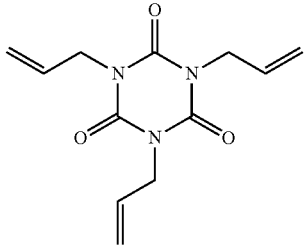

Chemical Formula 2-5

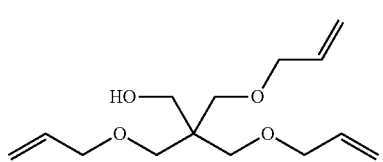

The first monomer and second monomer may be present in an amount of about 80 to about 99.9 weight percent, based on the total weight of the composition for a light emitting particle-polymer composite.

The thiol group of the first monomer and the unsaturated carbon-carbon bond of the second monomer may be present at a mole ratio of 1:about 0.75 to 1:about 1.25.

The composition for a light emitting particle-polymer composite may further include a third monomer having one thiol group located at a terminal end of the third monomer, a fourth monomer having one unsaturated carbon-carbon bond located at a terminal end of the fourth monomer, or a combination thereof.

The light emitting particle may further include a coating, the coating including a polymer having a carboxyl group or a salt thereof. The polymer having a carboxyl group or a salt thereof may include about 1 to about 20 mole percent (mol %) of the carboxyl group or the salt thereof. The polymer having a carboxyl group or a salt thereof may have a melting point ("Tm") of about 50 to about 300° C. The polymer having a carboxyl group or a salt thereof may include poly(alkylene-co-acrylic acid), poly(alkylene-co-methacrylic acid), a salt thereof, or a combination thereof. The polymer having a carboxyl group or a salt thereof may be present in an amount of about 50 to about 10,000 parts by weight, based on 100 parts by weight of the light emitting particle. The coated light emitting particle may be present as a powder or as a film.

According to still another embodiment of this disclosure, an optoelectronic device including the light emitting particle-polymer composite is provided. The optoelectronic device may include a light emitting device such as a light emitting diode ("LED") device or an organic light emitting diode ("OLED"), a memory device, a laser device, or a solar cell.

The light emitting device may include a light source, and the light emitting particle-polymer composite disposed on the light source.

The light emitting particle-polymer composite may be disposed on the light source, and a remaining space of the optoelectronic device may be filled with a resin. The resin may include a silicone resin, an epoxy resin, a (meth)acrylate-based resin, a copolymer of a first monomer including at least two thiol (—SH) groups, each located at a terminal end and a second monomer including at least two unsaturated carbon-carbon bonds, each located at a terminal end of the second monomer, or a combination thereof.

The light emitting device may include a light source, a resin disposed on the light source, a transparent plate covering the resin, and the light emitting particle-polymer composite disposed on the transparent plate. The transparent plate may be made of glass or a transparent polymer.

The light emitting device may further include a polymer film on an outer surface, and the polymer film may include a copolymer of a first monomer including at least two thiol (—SH) groups located at a terminal end of the first monomer, and a second monomer including at least two unsaturated carbon-carbon bonds located at a terminal end of the second monomer, a (meth)acrylate-based resin, a silicone resin, an epoxy resin, or a combination thereof.

Embodiments of this disclosure will be further described in the following detailed description.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1A:
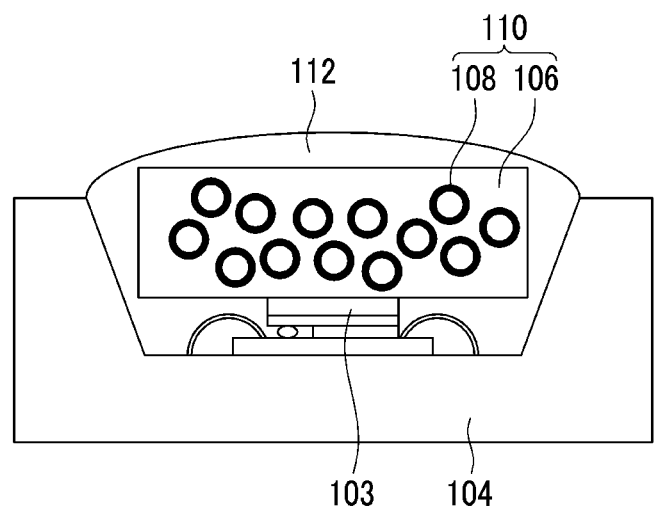
FIGS. 1A-1C and 2 to 5 are cross-sectional views of an embodiment of a light emitting diode including an embodiment of a light emitting particle-polymer composite.

This disclosure will be described more fully hereinafter in the following detailed description of this disclosure, in which some but not all embodiments of this disclosure are described. This disclosure may be embodied in many different forms and is not be construed as limited to the embodiments set forth herein; rather, these embodiments are provided so that this disclosure will fully convey the scope of the invention to those skilled in the art.

In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. As used herein, the term "and/or" includes any and all combinations of one or more of the associated listed items.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" means a straight or branched chain, saturated, monovalent hydrocarbon group (e.g., methyl or hexyl).

"Alkenyl" means a straight or branched chain, monovalent hydrocarbon group having at least one carbon-carbon double bond (e.g., ethenyl (—HC=CH$_2$)).

"Alkynyl" means a straight or branched chain, monovalent hydrocarbon group having at least one carbon-carbon triple bond (e.g., ethynyl).

"Alkylene" means a straight or branched chain, saturated, aliphatic hydrocarbon group having a valence of at least two, optionally substituted with one or more substituents where indicated, provided that the valence of the alkylene group is not exceeded.

"Alkenylene" means a straight or branched chain, divalent hydrocarbon group having at least one carbon-carbon double bond (e.g., ethenylene (—HC=CH—)).

"Alkoxy" means an alkyl group that is linked via an oxygen (i.e., alkyl-O—), for example methoxy, ethoxy, and sec-butyloxy groups.

"Arene" means a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

"Aryl" means a monovalent group formed by the removal of one hydrogen atom from one or more rings of an arene (e.g., phenyl or naphthyl).

"Arylene" means a group having a valence of at least two formed by the removal of at least two hydrogen atoms from one or more rings of an arene, wherein the hydrogen atoms may be removed from the same or different rings (e.g., phenylene or napthylene), optionally substituted with one or more substituents where indicated, provided that the valence of the arylene group is not exceeded.

"Aryloxy" means an aryl moiety that is linked via an oxygen (i.e., —O-aryl).

"Alkylaryl" means an alkyl group covalently linked to a substituted or unsubstituted aryl group that is linked to a compound (e.g., methyl-phenylene).

"Cycloalkyl" means a monovalent group having one or more saturated rings in which all ring members are carbon (e.g., cyclopentyl and cyclohexyl).

"Cycloalkylene" means a cyclic alkylene group, —C$_n$H$_{2n-x}$, wherein x represents the number of hydrogens replaced by cyclization(s), and having a valence of at least two, optionally substituted with one or more substituents where indicated, provided that the valence of the cycloalkylene group is not exceeded.

"Cycloalkenyl" means a monovalent group having one or more rings and one or more carbon-carbon double bond in the ring, wherein all ring members are carbon (e.g., cyclopentyl and cyclohexyl).

"Cycloalkynyl" means a stable aliphatic monocyclic or polycyclic group having at least one carbon-carbon triple bond, wherein all ring members are carbon (e.g., cyclohexynyl).

The term "substituted" means that the compound or group is substituted with at least one substituent selected independently from a C1 to C30 alkyl group, a C2 to C30 alkynyl group, a C6 to C30 aryl group, a C7 to C30 alkylaryl group, a C1 to C30 alkoxy group, a C1 to C30 aryloxy group, a C1 to C30 heteroalkyl group, a C3 to C30 heteroalkylaryl group, a C3 to C30 alicyclic group (e.g., a divalent tricyclododecane moiety), a C3 to C15 cycloalkenyl group, a C6 to C30 cycloalkynyl group, a C2 to C30 heterocycloalkyl group, a halogen (—F, —Cl, —Br, or —I), a hydroxyl group (—OH), a nitro group (—NO$_2$), a cyano group (—CN), an amino group (—NRR', wherein R and R' are hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR wherein R is a C1 to C6 alkyl group or a C6 to C12 aryl group), a carboxyl group or a salt thereof (—C(=O)OM wherein M is an organic or inorganic cation), a sulfonic acid (—SO$_3$H) or a salt thereof (—SO$_3$M wherein M is an organic or inorganic cation), phosphoric acid (—PO$_3$H$_2$) or a salt thereof (—PO$_3$MH or —PO$_3$M$_2$ wherein M is an organic or inorganic cation), instead of hydrogen, provided that the substituted atom's normal valence is not exceeded.

Throughout the present disclosure, reference is made to various heterocyclic groups. Within such groups, the term "hetero" means a group that comprises at least one ring member (e.g., 1 to 4 ring members) that is a heteroatom (e.g., 1 to 4 heteroatoms, each independently N, O, S, P, or Si). In each instance, the total number of ring members may be indicated (e.g., a 3- to 10-membered heterocycloalkyl). If multiple rings are present, each ring is independently aromatic, saturated or partially unsaturated and multiple rings, if present, may be fused, pendant, spirocyclic or a combination thereof. Heterocycloalkyl groups comprise at least one non-aromatic ring that contains a heteroatom ring member. Heteroaryl groups comprise at least one aromatic ring that contains a heteroatom ring member. Non-aromatic and/or carbocyclic rings may also be present in a heteroaryl group, provided that at least one ring is both aromatic and contains a ring member that is a heteroatom.

As used herein, the term "aliphatic organic group" refers to a C1 to C30 linear or branched alkyl group.

The term "aromatic organic group" refers to a C6 to C30 aryl group or a C2 to C30 heteroaryl group.

The term "alicyclic organic group" refers to a C3 to C30 cycloalkyl group, a C3 to C30 cycloalkenyl group, or a C3 to C30 cycloalkynyl group.

As used herein, the term "combination thereof" refers to a mixture, a stacked structure, a composite, an alloy, a blend, a reaction product, or the like.

As used herein, (meth)acrylate refers to an acrylate or a methacrylate.

The composition for a light emitting particle-polymer composite according to an embodiment includes a light emitting particle, a first monomer including at least two thiol (—SH) groups, each located at a terminal end of the first monomer, and a second monomer including at least two unsaturated carbon-carbon bonds, each located at a terminal end of the second monomer.

The light emitting particle may include a nanocrystal, a phosphor, a pigment, or a combination thereof. The nanocrystal may include a semiconductor nanocrystal, a metal nanocrystal, a metal oxide nanocrystal, or a combination thereof. The semiconductor nanocrystal may include a Group II-VI compound, a Group III-V compound, a Group IV-VI compound, a Group IV compound, a Group IV element, or a combination thereof, wherein the term "Group" refers to a Group of the Periodic Table of the Elements.

The Group II-VI compound includes a binary compound selected from CdSe, CdTe, ZnS, ZnSe, ZnTe, ZnO, HgS, HgSe, HgTe, MgSe, MgS, or a combination thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group III-V compound includes a binary compound selected from GaN, GaP, GaAs, GaSb, AlN, AlP, AlAs, AlSb, InN, InP, InAs, InSb, or a combination thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group IV-VI compound includes a binary compound selected from SnS, SnSe, SnTe, PbS, PbSe, PbTe, or a combination thereof; a ternary compound selected from SnSeS, SnSeTe, SnSTe, PbSeS, PbSeTe, PbSTe, SnPbS, SnPbSe, SnPbTe, or a combination thereof; or a quaternary compound selected from SnPbSSe, SnPbSeTe, SnPbSTe, or a combination thereof. The Group IV element includes Si or Ge, and the Group IV compound includes a binary compound selected from SiC, SiGe, or a combination thereof.

Herein, the element, the binary compound, the ternary compound, or the quaternary compound may be present in a particle having a substantially uniform concentration, or may be present in a particle having different concentration distributions in the same particle. In addition, the particle may have a core/shell structure in which a first semiconductor nanocrystal is surrounded by a second semiconductor nanocrystal. The core and shell may have an interface, and an element of at least one of the core or the shell may have a concentration gradient which decreases in a direction from the surface of the particle to a center of the particle.

The semiconductor nanocrystal may have a particle diameter (e.g., an average largest particle diameter) ranging from about 1 nanometer (nm) to about 100 nm, specifically about 1 nm to about 50 nm, more specifically about 1 nm to about 10 nm, or about 2 nm to about 25 nm. The particle diameter may refer to a longest dimension when the semiconductor nanocrystal does not have a spherical shape.

In addition, the semiconductor nanocrystal may have any shape, and may be spherical, pyramidal, or multi-armed. In an embodiment, the semiconductor nanocrystal may be a cubic nanoparticle, a nanotube, a nanowire, a nanofiber, a nanoplate particle, or the like, or a combination thereof.

In addition, a method of synthesizing the semiconductor nanocrystal according to an embodiment may have no particular limit, and may include any method provided in a related field. For example, it may include the following method. This method of preparing a semiconductor nanocrystal is not limited, but may include any method which may be determined by one of ordinary skill in the art without undue experimentation.

For example, a wet chemical process may be used to provide a semiconductor nanocrystal having a nano-size and even several nano-sizes. Nanocrystal particles may be provided by adding a precursor material to an organic solvent. When the crystal grows, the organic solvent or an organic ligand surrounds the surface of the semiconductor nanocrystal and can control growth of the crystal.

In addition, the synthesized semiconductor nanocrystal may be used to prepare a nanocrystal-resin composite including a resin matrix wherein the nanocrystal is dispersed by being combined with the resin and curing the resin, so that it may be applied to various fields. According to an embodiment, a first monomer including at least two thiol (—SH) groups, each located at a terminal end of the first monomer and a second monomer including at least two unsaturated carbon-carbon bonds, each located at a terminal end of the second monomer are polymerized to provide a polymer that may be used as a matrix to stabilize a nanocrystal.

The phosphor and pigment used in the light emitting particle-polymer composite may be any phosphor and/or pigment without limitation. The phosphor or pigment may have a particle diameter ranging from about 1 nm to about 100 nm, specifically about 1 nm to about 50 nm, more specifically about 1 nm to about 10 nm, or about 2 nm to about 25 nm. The particle diameter may refer to the longest dimension when the semiconductor nanocrystal does not have a spherical shape.

The first monomer including at least two thiol (—SH) groups, each located at a terminal end of the first monomer may be represented by the following Chemical Formula 1.

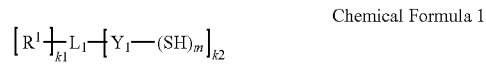

Chemical Formula 1

In Chemical Formula 1, $R^1$ is hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a substituted or unsubstituted C2 to C30 alkenyl group, a substituted or unsubstituted C2 to C30 alkynyl group, a substituted or unsubstituted C3 to C30 alicyclic group including a ring having a double bond or a triple bond in the ring, a substituted or unsubstituted C3 to C30 heterocycloalkyl group including a ring having a double bond or a triple bond in the ring, a C3 to C30 alicyclic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxyl group, —$NH_2$, a substituted or unsubstituted C1 to C30 amine group of formula —NRR' wherein R and R' are each independently hydrogen or a C1 to C30 alkyl group, an isocyanate group, an isocyanurate group, a (meth)acrylate group, a halogen, —ROR' wherein R is a substituted or unsubstituted C1 to C20 alkylene group and R' is hydrogen or a C1 to C20 alkyl group, an acyl halide of formula —RC(O)X wherein R is a substituted or unsubstituted alkylene group and X is a halogen, —C(=O)OR' wherein R' is hydrogen or a C1 to C20 alkyl group, —CN, or —C(=O)ONRR' wherein R and R' are each independently hydrogen or a C1 to C20 alkyl group;

$L_1$ is a single bond, a substituted or unsubstituted C1 to C30 alkylene group, a substituted or unsubstituted C6 to C30 arylene group, or a substituted or unsubstituted C3 to C30 heteroarylene group, a substituted or unsubstituted C3 to C30 cycloalkylene group, or a substituted or unsubstituted C3 to C30 heterocycloalkylene group;

$Y_1$ is a single bond a substituted or unsubstituted C1 to C30 alkylene group a substituted or unsubstituted C2 to C30 alkenylene group; or a C1 to C30 alkylene group or a C2 to C30 alkenylene group wherein at least one methylene (—$CH_2$—) group is replaced by a sulfonyl (—$SO_2$—), a carbonyl (—C(=O)—), an ether (—O—), a sulfide (—S—), a sulfoxide (—SO—), an ester (—C(=O)O—), an amide of formula —C(=O)NR— wherein R is hydrogen or a C1 to C10 alkyl group, an imine of formula —NR— wherein R is hydrogen or a C1 to C10 alkyl group, or a combination thereof;

m is an integer of 1 or more and m does not exceed the valance of $Y_1$;

k1 is an integer of 0 or 1 or more;

k2 is an integer of 1 or more; and the sum of m and k2 is an integer of 3 or more.

k1 and k2 does not exceed the valence of the $L_1$ in Chemical Formula 1.

In an embodiment, the sum of m and k2 is 1 to 6, specifically 2 to 5. In an embodiment, m is 1, k1 is 0, and k2 is 3 to 4.

The second monomer may be represented by the following Chemical Formula 2.

Chemical Formula 2

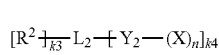

In Chemical Formula 2,

X is a C1 to C30 aliphatic organic group including an unsaturated carbon-carbon bond, a C6 to C30 aromatic organic group including an unsaturated carbon-carbon bond, or a C3 to C30 alicyclic organic group including an unsaturated carbon-carbon bond;

$R^2$ is hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C2 to C30 alkenyl group, a C2 to C30 alkynyl group, a substituted or unsubstituted C3 to C30 alicyclic group including a ring having double bond or a triple bond in the ring, a substituted or unsubstituted C3 to C30 heterocycloalkyl group including a ring having double bond or a triple bond in the ring, a C3 to C30 alicyclic group substituted with a C2 to C30 alkenyl group or a C2 to C30 alkynyl group, a C3 to C30 heterocycloalkyl group substituted with a C2 to C30 alkenyl group or a C2 to C30 alkynyl group, a hydroxy group, —$NH_2$, a substituted or unsubstituted C1 to C30 amine group of formula —NRR' wherein R and R' are each independently hydrogen or a C1 to C30 alkyl group, an isocyanate group, an isocyanurate group, a (meth)acrylate group, a halogen, —ROR' wherein R is a substituted or unsubstituted C1 to C20 alkylene group and R' is hydrogen or a C1 to C20 alkyl group, an acyl halide of formula —RC(O)X wherein R is a substituted or unsubstituted alkylene group and X is a halogen, —C(=O)OR' wherein R' is hydrogen or a C1 to C20 alkyl group, —CN, or —C(=O)ONRR' wherein R and R' are each independently hydrogen or a C1 to C20 alkyl group;

$L_2$ is a single bond, a substituted or unsubstituted C1 to C30 alkylene group, a substituted or unsubstituted C6 to C30 arylene group, or a substituted or unsubstituted C3 to C30 heteroarylene group;

$Y_2$ is a single bond, a substituted or unsubstituted C1 to C30 alkylene group, or a substituted or unsubstituted C2 to C30 alkenylene group; or a C1 to C30 alkylene group or a C2 to C30 alkenylene group wherein at least one methylene (—$CH_2$—) group is replaced by a sulfonyl (—S(=O)$_2$—), a carbonyl (—C(=O)—), an ether (—O—), a sulfide (—S—), a sulfoxide (—S(=O)—), an ester (—C(=O)O—), an amide of formula —C(=O)NR— wherein R is hydrogen or a C1 to C10 alkyl group, an imine of formula —NR— wherein R is hydrogen or a C1 to C10 alkyl group, or a combination thereof;

n is an integer of 1 or more and n does not exceed the valance of $Y_2$;

k3 is an integer of 0 or 1 or more;

k4 is an integer of 1 or more; and the sum of n and k4 is an integer of 3 or more.

k3 and k4 does not exceed the valence of the $L_2$ in Chemical Formula 2.

In an embodiment, the sum of n and k4 is 1 to 6, specifically 2 to 5. In another embodiment, n is 1, k3 is 0, and k4 is 3 to 4.

Examples of the first monomer of the above Chemical Formula 1 may include a monomer of the following Chemical Formula 1-1.

Chemical Formula 1-1

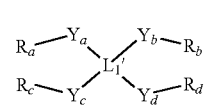

In Chemical Formula 1-1, $L_1'$ is carbon, a substituted or unsubstituted C6 to C30 arylene group, a substituted or a unsubstituted C6 to C30 heteroarylene group, a substituted or unsubstituted C3 to C30 cycloalkylene group, or a substituted or unsubstituted C3 to C30 heterocycloalkylene group;

each of $Y_a$ to $Y_d$ is independently a substituted or unsubstituted C1 to C30 alkylene group; a substituted or unsubstituted C2 to C30 alkenylene group; or a C1 to C30 alkylene group or a C2 to C30 alkenylene group wherein at least one methylene (—$CH_2$—) group is replaced by sulfonyl (—S(=O)$_2$—), carbonyl (—C(=O)—), ether (—O—), sulfide (—S—), sulfoxide (—S(=O)—), ester (—C(=O)O—), amide of formula —C(=O)NR— wherein R is hydrogen or a C1 to C10 alkyl group, or a combination thereof; and $R_a$ to $R_d$ are $R^1$ of Chemical Formula 1 or —SH, provided that at least two of $R_a$ to $R_d$ are —SH.

In an embodiment, $L_1'$ is a substituted or unsubstituted phenylene group, and thus the substituted or unsubstituted C6 to C30 arylene group may be a substituted or unsubstituted phenylene group.

Examples of the first monomer of the above Chemical Formula 1 include the compounds represented by of the following Chemical Formulas 1-2 to 1-5.

Chemical Formula 1-2

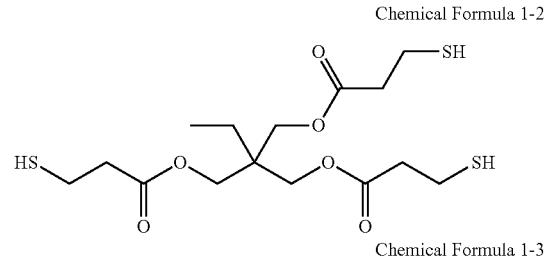

Chemical Formula 1-3

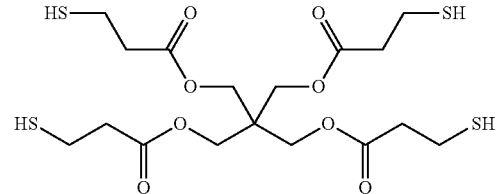

Chemical Formula 1-4

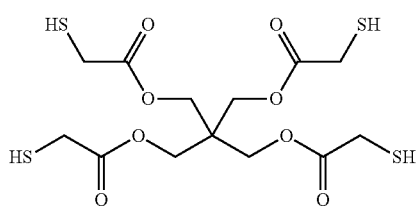

Chemical Formula 1-5

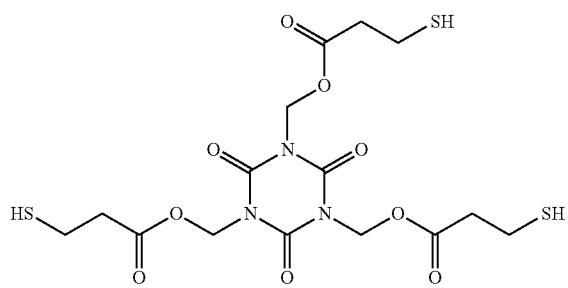

Chemical Formula 2-1

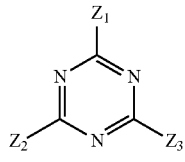

Chemical Formula 2-2

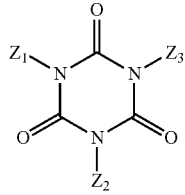

In Chemical Formulas 2-1 and 2-2, $Z_1$ to $Z_3$ are the same or different, and correspond to —[$Y_2$—$X_n$] of Chemical Formula 2.

Examples of the second monomer may include the compounds of the following Chemical Formulas 2-3 to 2-6.

Chemical Formula 2-3

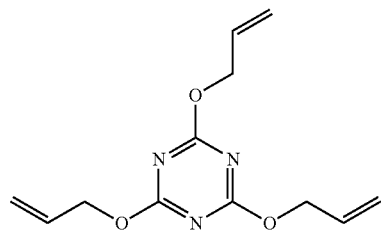

Chemical Formula 2-4

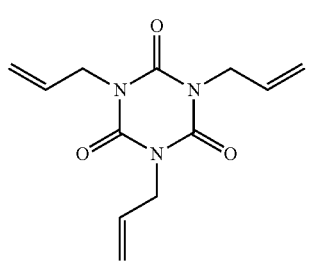

In Chemical Formula 2, X may be same or different and may be a C1 to C30 aliphatic organic group including a carbon-carbon double bond, a C6 to C30 aromatic organic group including a carbon-carbon double bond or a C3 to C30 alicyclic organic group including a carbon-carbon double bond. X may be an acrylate group, a methacrylate group; a C2 to C30 alkenyl group, a C2 to C30 alkynyl group, a substituted or unsubstituted C3 to C30 alicyclic group including a ring having a double bond or a triple bond in the ring, a substituted or unsubstituted C3 to C30 heterocycloalkyl group including a ring having double bond or a triple bond in the ring, a C3 to C30 alicyclic group substituted with a C2 to C30 alkenyl group (e.g., an ethenyl group, an acrylate group, or the like) or a C2 to C30 alkynyl group, or a C3 to C30 heterocycloalkyl group substituted with a C2 to C30 alkenyl group or a C2 to C30 alkynyl group. For example, X may be a dicyclopentanyl (also known as tetrahydrocyclopentadienyl or octahydro-1H-4,7-methanoindenyl)

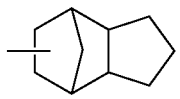

substituted with —$CH_2$—$OCOCH$=$CH_2$.

In Chemical Formula 2, X may be an alkenyl group, a vinyl group or an allyl group, or a substituted or unsubstituted C3 to C30 alicyclic group including a ring having a double bond or a triple bond in the ring. In an embodiment X may be a norbornene group, a maleimide group, a nadimide group, a tetrahydrophthalimide group, or a combination thereof.

In Chemical Formula 2, $L_2$ may be a pyrrolidine group, a tetrahydrofuran group, a pyridine group, a pyrimidine group, a piperidine group, a triazine group, or an isocyanurate group.

Examples of the second monomer of the above Chemical Formula 2 may include the compounds of the following Chemical Formulas 2-1 to Chemical Formula 2-2.

Chemical Formula 2-5

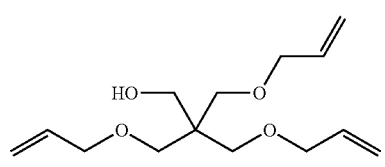

Chemical Formula 2-6

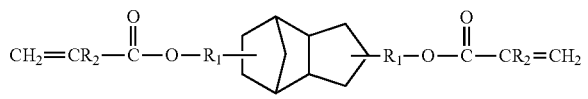

Wherein $R_1$ is a C1 to C20 alkylene group, or a substituted C1 to C20 alkylene group having a sulfonyl moiety (—S($=$O)$_2$—), a carbonyl moiety (—C($=$O)—), an ether moiety (—O—), a sulfide moiety (—S—), a sulfoxide moiety (—S($=$O)—), an ester moiety (—C($=$O)O—), an amide moiety (—C($=$O)NR—) (wherein R is hydrogen or a C1 to C10 straight or branched alkyl group), an imine moiety (—NR—) (wherein R is hydrogen or a C1 to C10 alkyl group) substituted for a methylene group included therein, and $R_2$ is hydrogen or a methyl group.

The light emitting particle may be present in an amount of about 0.1 to about 20 weight percent (wt %), specifically about 0.5 to about 15 wt %, more specifically about 1 to about 10 wt %, based on the total weight of the composition for a light emitting particle-polymer composite, and the first monomer and the second monomer may in combination be present in an amount of about 80 to about 99.9 wt %, specifically about 85 to about 99 wt %, more specifically about 90 to about 95 wt %, based on the total weight of the composition for a light emitting particle-polymer composite. A ratio of the weight of the first monomer and the second monomer may be about 0.1:1 to about 1:0.1, specifically about 0.2:1 to about 1:0.2, more specifically about 0.75:1 to about 1:0.75. When the light emitting particle and the first and the second monomers are present within the above ranges, a stable light emitting particle-polymer composite may be provided.

The thiol group of the first monomer and the unsaturated carbon-carbon bond of the second monomer may be present at a mole ratio of 1:about 0.75 to 1:about 1.25. When the first and second monomers are used within the above ranges, a light emitting particle-polymer composite may have a high density network and excellent mechanical strength and barrier properties.

The composition for a light emitting particle-polymer composite may further include a third monomer having one thiol group located at a terminal end of the third monomer, a fourth monomer having one unsaturated carbon-carbon bond located at a terminal end of the fourth monomer, or a combination thereof.

The third monomer is the compound represented by Chemical Formula 1 wherein m and k2 are each 1 and the fourth monomer is the compound represented by Chemical Formula 2 wherein n and k4 are each 1.

The light emitting particle may further comprise a coating, the coating comprising a polymer having a carboxyl group or a salt thereof. Thus, the light emitting particle may be pre-coated with a polymer having a carboxyl group or a salt thereof. The carboxyl group may include an acrylic acid group, a methacrylic acid group, or a salt thereof. The polymer having a carboxyl group or a salt thereof may include about 1 to about 100 mol %, specifically about 2 to about 50 mol %, more specifically about 4 to about 20 mol % of a unit including the carboxyl group or a salt thereof. When the unit including a carboxyl group or a salt thereof is included within the above range in the polymer, a stability of the composite may be improved. The polymer may have a melting point ("$T_m$") of about 50° C. to about 300° C., specifically about 60° C. to about 250° C., more specifically about 70° C. to about 200° C. When the polymer has a melting point within the above range, the polymer may stably coat the light emitting particle.

The coated light emitting particle may be present as a powder or as a film. A coated light emitting particle in a form of a powder and the first and second monomers may be combined to provide a composite, or alternatively, a coated light emitting particle in a form of a film and the first and second monomers may be combined to provide a composite. The polymer having a carboxyl group or a salt thereof may include the carboxyl group or a salt thereof in a long aliphatic chain, for example a C8 to C50, or a C12 to C36 aliphatic chain.

The polymer having a carboxyl group or a salt thereof may include poly(alkylene-co-acrylic acid), poly(alkylene-co-methacrylic acid), a salt thereof, or a combination thereof. The salt may be a compound including a metal such as sodium, zinc, indium, gallium, or the like, instead of hydrogen of the carboxyl group. Examples of the salt include a poly(ethylene-co-acrylic acid) zinc salt, a poly (ethylene-co-methacrylic acid) zinc salt, or the like.

The polymer having a carboxyl group or a salt thereof may be present in an amount of about 50 to about 10,000 parts by weight, specifically about 200 to about 10,000 parts by weight, more specifically about 400 to about 5,000 parts by weight, based on 100 parts by weight of the light emitting particle. In the light emitting particle coated with the polymer having a carboxyl group or a salt thereof, the light emitting particle may be present in an amount of about 1 to about 70 wt %, specifically about 1 to about 50 wt %, more specifically about 2 to about 40 wt %, based on the total weight of the light emitting particle and the polymer having a carboxyl group or a salt thereof. When the composition of the coated light emitting particle is within the foregoing range, a stability of the light emitting particle may be improved.

The composition for a light emitting particle-polymer composite may be cured to provide a light emitting particle-polymer composite wherein a light emitting particle is dispersed in a polymer matrix. The curing process may be performed using ultraviolet ("UV") rays, for example.

In an embodiment, in order to stabilize the light emitting particle during the preparation of the light emitting particle-polymer composite, the light emitting particle and the first monomer may be first combined, and then the second monomer may be subsequently added.

The composition for a light emitting particle-polymer composite may further include an initiator to promote a cross-linking reaction between a thiol group and an unsaturated carbon-carbon bond. The initiator may include phosphine oxide, α-amino ketone, phenyl glyoxylate, monoacyl phosphine, benzylmethyl ketal, hydroxyketone, or the like, or combination thereof.

The polymer may have suitable compatibility with the light emitting particle and may be cured at room temperature in a suitable time. Thus, a high temperature process, which may cause deterioration of a stability of a light emitting particle, may be omitted. Also the polymer may form a dense cross-linking structure, and may substantially or effectively prevent permeation of oxygen or moisture, which may originate outside the composite, from contacting and/or reacting with the light emitting particle.

The light emitting particle-polymer composite may stably maintain optical characteristics of the light emitting particle, and it may be applied to various fields. For example, it may be used for an optoelectronic device, for example a light emitting device such as a light emitting diode ("LED") device or an organic light emitting diode ("OLED"), a memory device, a laser device, a solar cell, or like. The light emitting particle-polymer composite may be applied to a physiological field, such as a biotechnology application, or the like.

Hereinafter, a light emitting diode according to an embodiment is further disclosed. Referring to FIGS. 1A-1C and 2 to 5, a light emitting diode including a light emitting particle-resin composite as a light emitting material is further disclosed.

FIGS. 1A-1C and 2 to 5 are cross-sectional views of an embodiment of a light emitting diode including a light emitting particle-polymer composite.

Figure 1B:
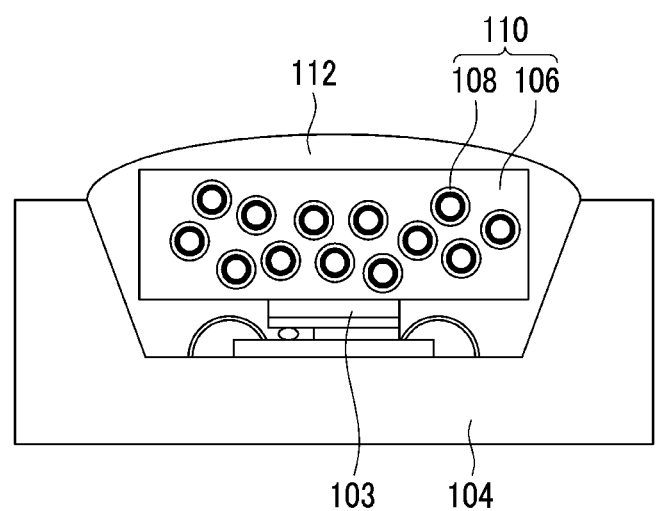
Figure 1C:
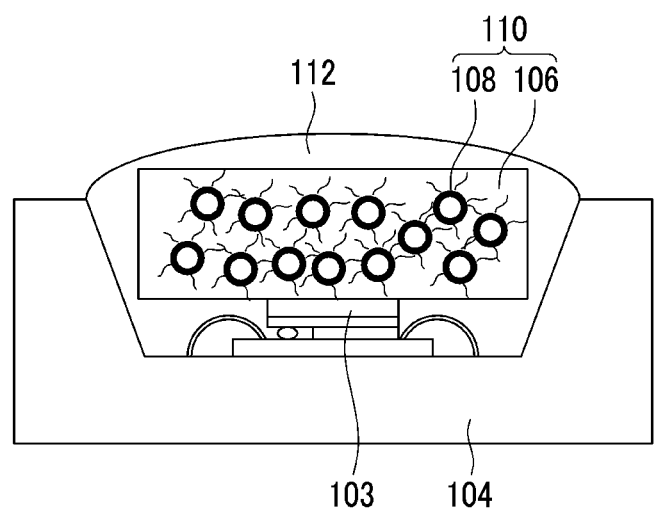

Referring to FIGS. 1A-1C, the light emitting diode includes a substrate 104 comprising Ag or the like, a light emitting diode chip 103 emitting in a blue or an ultraviolet ("UV") region on the substrate 104, and a light emitting particle-polymer composite 110 on the light emitting diode chip 103. As a light source of the light emitting diode, a laser, a lamp, or the like, instead of the light emitting diode chip, may be used.

In general, a light emitting particle is disposed on a light emitting diode chip by mixing it with a highly transparent resin such as a silicone resin or an epoxy resin followed by thermal curing. However, the silicone resin has undesirably poor compatibility with the nanocrystal and therefore the resulting composite has reduced efficiency. Also, porosity present after curing is undesirably high, resulting in easy transmission of oxygen or moisture. Also, the epoxy resin has an undesirably low life-span.

In an embodiment, as further described above, a polymer 106 having sufficient compatibility with a light emitting particle 108 and excellent barrier properties for oxygen or moisture is used to provide the composite 110 with the light emitting particle 108.

The light emitting particle 108 may be a red, green, yellow, or blue-emitting light emitting particle 108. The light emitting particle-polymer composite 110 is disposed on a recessed portion of the substrate 104, and covers the light emitting diode chip 103. The light emitting particle-polymer composite 110 is present on the light emitting diode chip 103, and a remaining space may be filled with a resin 112. The light emitting particle-polymer composite 110 may be provided in a film form on the light emitting diode chip 103, but is not limited thereto. Resin 112 is transparent, compatible with the light emitting particle-polymer composite, and suitable for the intended use of the light emitting device. Such a resin 112 may include a silicone resin, an epoxy resin, a (meth)acrylate-based resin, or a copolymer of a first monomer including at least two thiol (—SH) groups located at a terminal end of the first monomer and a second monomer including at least two unsaturated carbon-carbon bonds located at a terminal end of the second monomer.

Figure 2:
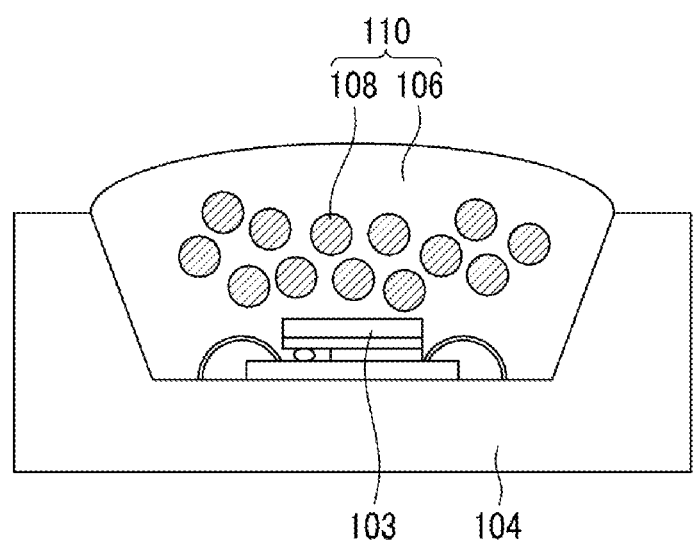

As shown in FIG. 2, the light emitting particle-polymer composite 110 may be provided by applying a composition for a light emitting particle-polymer composite in a recessed portion of a substrate 104, followed by curing.

Figure 3:
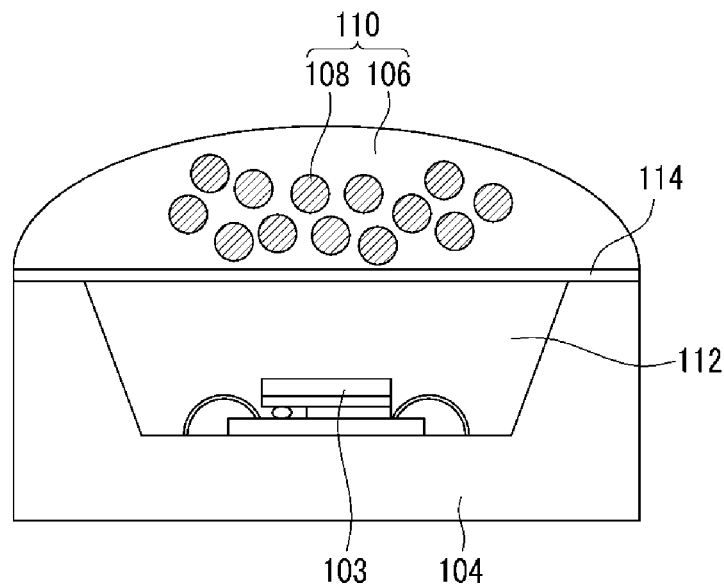
Figure 4:
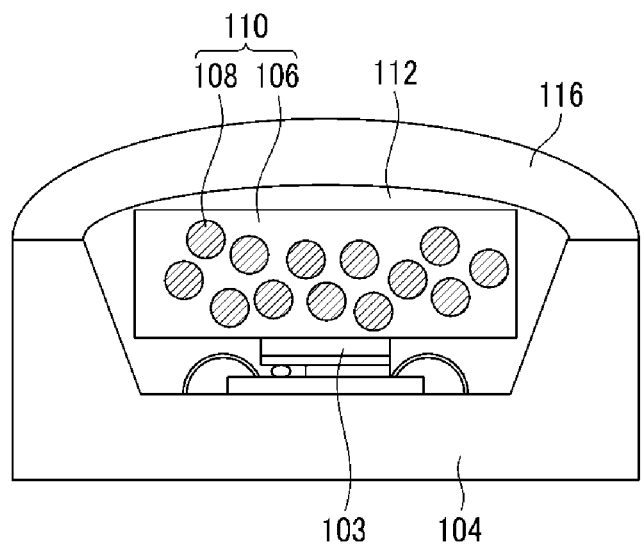
Figure 5:
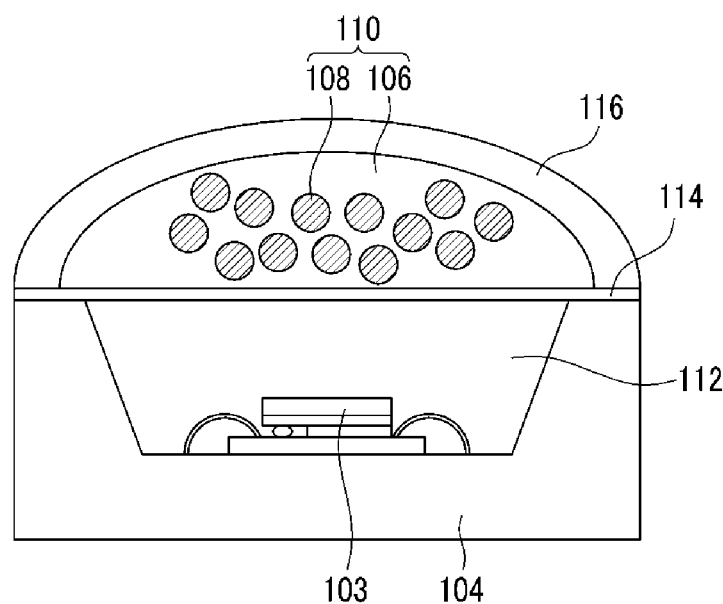

Referring to FIG. 3, an embodiment of the light emitting diode includes a substrate 104 comprising Ag or the like, a light emitting diode chip 103 emitting in a blue or ultraviolet ("UV") region on the substrate 104, and a light emitting particle-polymer composite 110 on the light emitting diode chip 103. A resin 112 as described above is disposed in a recessed portion of the substrate 104. Such a resin 112 may include a silicone resin, an epoxy resin, a (meth)acrylate-based resin, or a copolymer of a first monomer including at least two thiol (—SH) groups located at a terminal end of the first monomer and a second monomer including at least two unsaturated carbon-carbon bonds located at a terminal end of the second monomer. A transparent plate 114 is present on the resin 112, and a light emitting particle-polymer composite 110 is present on the transparent plate 114. The transparent plate 114 may comprise glass or a transparent polymer. While not wanting to be bound by theory, it is believed that the structure of FIG. 3 substantially or effectively prevents the light emitting particle 108 from being degraded by a light emitting diode chip 103. FIG. 4 shows a light emitting diode including a polymer film 116 as a barrier film encapsulating an outer surface of the light emitting diode (e.g., on an entire upper surface of the resin 112) shown in FIGS. 1A-1C and 2, and FIG. 5 shows a light emitting diode including a polymer film 116 encapsulating an outer surface of the light emitting diode (e.g., on entire upper surface of the light emitting particle-polymer composite 110) shown in FIG. 3.

The polymer film 116 comprises a resin having excellent barrier properties for oxygen or moisture, and the resin may be a copolymer of a first monomer including at least two thiol (—SH) groups located at a terminal end of the first monomer and a second monomer including at least two unsaturated carbon-carbon bonds located at a terminal end of the second monomer, a (meth)acrylate-based resin, a silicone resin, an epoxy resin, or combination thereof. The copolymer of the first monomer including at least two thiol (—SH) groups located at a terminal end of the first monomer and the second monomer including at least two unsaturated carbon-carbon bonds located at a terminal end of the second monomer may be prepared through polymerization of the first and second monomers at various mole ratios. Polymerization between the first and second monomers is not limited to a specific mole ratio.

According to an embodiment, a light emitting device is provided that includes a first electrode and a second electrode opposite the first electrode, and the light emitting particle-resin composite between the first electrode and the second electrode.

The light emitting particle 108 absorbs light from the light emitting diode chip 103 and emits light with a different wavelength. In an embodiment, a wavelength of the emitted light is shorter than a wavelength of the light emitted from the light emitting diode chip 103. The light emitting particle 108 may have variously-regulated light emitting wavelengths. For example, a white light emitting diode may be fabricated by combining red and green nano-complex particles with a blue light emitting diode chip. Alternatively, another white light emitting diode may be fabricated by combining red, green, and blue nano-complex particles with an ultraviolet ("UV") light emitting diode chip. A light emitting device which emits light of various wavelengths may be provided by use of light emitting particles which emit light with various wavelengths with a light emitting diode chip.

Figure 6:
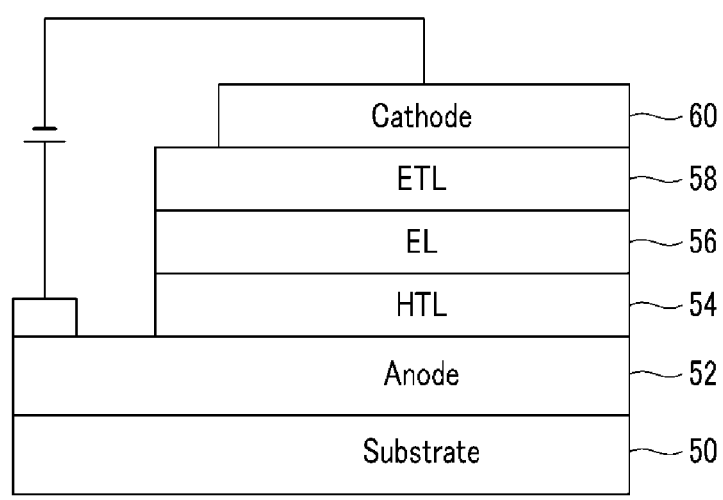
FIG. 6 is a cross-sectional view of an embodiment of an electric field light emitting device including a light emitting particle-polymer composite.

Referring to FIG. 6, a current-driven light emitting device including a light emitting particle-polymer composite as a light emitting material is further described.

FIG. 6 is a cross-sectional view of an embodiment of a light emitting device including a light emitting particle-polymer composite.

The light emitting device may include an organic light emitting diode ("OLED"), a light emitting diode ("LED") device, a memory device, a laser device, an optoelectronic device, an organic optoelectronic device, or a solar cell. The organic light emitting diode ("OLED") may be fabricated by forming an emission layer between two electrodes. Excitons may be produced by injecting electrons and holes from the two electrodes into the organic emission layer to thereby produce excitons by combination of the electrons and holes. Light is generated when the excitons fall to a ground state from an excited state.

For example, as illustrated in FIG. 6, an OLED includes an anode 52 on an organic substrate 50. The anode 52 may comprise a material having a high work function so that the holes may be injected. Non-limiting examples of the material of the anode 52 include indium tin oxide ("ITO") and a transparent oxide of indium oxide. On the anode 52, a hole transport layer ("HTL") 54, an emission layer ("EL") 56, and an electron transport layer ("ETL") 58 are sequentially disposed. The hole transport layer 54 may include a p-type semiconductor, and the electron transport layer 50 may include an n-type semiconductor or a metal oxide. The emission layer 56 includes the light emitting particle-polymer composite 110. The light emitting particle-polymer composite 110 may be formed by applying it directly or by fabricating it in a film form and then laminating it to provide an emission layer.

A cathode 60 is provided on the electron transport layer 58. The cathode 60 may comprise a material having a low work function so that electrons can be easily injected into the electron transport layer 58. Examples of the material for forming the cathode 60 include a metal, and metal may comprise magnesium, calcium, sodium, potassium, titanium, indium, yttrium, lithium, gadolinium, aluminum, silver, tin, lead, cesium, barium, an alloy thereof, or a combination thereof, and may have a multi-layer structure. The cathode may be a material having a layered structure such as LiF/Al, LiO$_2$/Al, LiF/Ca, LiF/Al, or BaF$_2$/Ca, and is not limited thereto. Since a method for fabricating the anode 52, the hole transport layer 54, the emission layer 56, the electron transport layer 58, and the cathode 60 and a method for assembling them are widely known to those skilled in the art and can determined without undue experimentation, these methods will not be further described in detail in this specification.

Hereinafter, the embodiments are illustrated in more detail with reference to examples. However, the following are exemplary embodiments and shall not be limiting.

Example 1

Preparation of a Nanocrystal-Polymer Composite

Yellow InP/ZnS/InZnS/ZnS nanocrystal is added to chloroform to prepare a solution having an optical density ("OD") of 0.027 when measured by diluting the solution by 100 times in toluene. A 0.9 milliliter (ml) quantity of the solution is mixed with 0.2 grams (g) of pentaerythritol tetrakis(3-mercaptopropionate) as a first monomer and 0.14 g of 1,3,5-triallyl-1,3,5-triazine-2,4,6(1H,3H,5H)-trione as a second monomer. Then, the solvent is removed from the solution. Next, 100 parts by weight of the mixture of the first and second monomers are mixed with 2 parts by weight of oxy-phenyl-acetic acid 2-[2-oxo-2-phenyl-acetoxy-ethoxy]-ethyl ester. The resulting mixture is polymerized by radiating UV for 10 minutes at a room temperature of about 25° C., to prepare a nanocrystal-polymer composite film.

Example 2

Preparation of a Nanocrystal-Polymer Composite

Red InP/ZnSeS/ZnS nanocrystal is added to chloroform to prepare a solution having an OD of 0.035 when measured by diluting the solution by 100 times in toluene. A 0.1 ml quantity of the solution is mixed with 0.2 g of pentaerythritol tetrakis(3-mercaptopropionate) as a first monomer and 0.14 g of 1,3,5-triallyl-1,3,5-triazine-2,4,6(1H,3H,5H)-trione as a second monomer. The solvent is removed from the solution. 100 parts by weight of the first and second monomer mixture is mixed with 1 part by weight of oxy-phenyl-acetic acid 2-[2-oxo-2-phenyl-acetoxy-ethoxy]-ethyl ester. The resulting mixture is polymerized by radiating UV at a room temperature of about 25° C. for 5 minutes, preparing a nanocrystal-polymer composite film.

Example 3

Preparation of a Nanocrystal-Polymer Composite

Green InZnP/ZnSeS/ZnS nanocrystal is added to chloroform to prepare a solution having an OD of 0.042 when measured by diluting it by 100 times in toluene. A 0.5 ml quantity of the solution is mixed with a mixture of 0.43 g of pentaerythritol tetrakis (3-mercaptopropionate) as a first monomer and 0.3 g of 1,3,5-triallyl-1,3,5-triazine-2,4,6(1H, 3H,5H)-trione as a second monomer. Then, the solvent is removed from the solution. Then, 1 part by weight of oxy-phenyl-acetic acid 2-[2-oxo-2-phenyl-acetoxy-ethoxy]-ethyl ester is mixed with 100 parts by weight of the first and second monomer mixture. The resulting mixture is polymerized by radiating UV at a room temperature of about 25° C. for 5 minutes, preparing a nanocrystal-polymer composite film.

Example 4

Preparation of a Nanocrystal-Polymer Composite

A nanocrystal-polymer composite is prepared according to the same method as Example 1, except for using 2,4,6-triallyloxy-1,3,5 triazine instead of 1,3,5-triallyl-1,3,5-triazine-2,4,6(1H,3H,5H)-trione as a second monomer.

Example 5

Preparation of a Nanocrystal-Polymer Composite

A nanocrystal-polymer composite is prepared according to the same method as Example 2, except for using 2,4,6-triallyloxy-1,3,5 triazine instead of 1,3,5-triallyl-1,3,5-triazine-2,4,6(1H,3H,5H)-trione as a second monomer.

Example 6

Preparation of a Nanocrystal-Polymer Composite

A nanocrystal-polymer composite is prepared according to the same method as Example 3, except for using 2,4,6-triallyloxy-1,3,5 triazine instead of 1,3,5-triallyl-1,3,5-triazine-2,4,6(1H,3H,5H)-trione as a second monomer.

Examples 7 to 12

Fabrication of a Light Emitting Diode ("LED")

A light emitting diode having a structure shown in FIGS. 1A-1C is fabricated by preparing a circuit board having a Ag frame and a light emitting diode chip, which emits 445 nm blue light, in a recessed portion of the circuit board. The nanocrystal-polymer composite films according to Examples 1 to 6 are respectively positioned to cover the Ag frame and the light emitting diode chip in the recessed portion of the circuit board. Polydimethylsiloxane resin is filled in an empty space of the circuit board to cover the Ag frame and the light emitting diode chip therein, and cured at 150° C. for 2 hours.

Comparative Examples 1 to 3

Fabrication of a Light Emitting Diode ("LED")

InP/ZnS/InZnS/ZnS, InP/ZnSeS/ZnS, and InZnP/ZnSeS/ZnS are respectively mixed with a polydimethylsiloxane resin. Then, a light emitting diode is fabricated by preparing a circuit board having a Ag frame and a light emitting diode chip, which emits 445 nm blue light, in a recessed portion of the circuit board, disposing the mixture of the nanocrystal and the polydimethylsiloxane resin to cover the Ag frame and the light emitting diode chip in the recessed portion of the circuit board, and curing it at 150° C. for 2 hours.

Examples 13 and 14

Fabrication of a Light Emitting Diode ("LED")

A light emitting diode ("LED") having a structure shown in FIGS. 1A-1C is fabricated by preparing a circuit board having a Ag frame and a light emitting diode chip, which emits 445 nm blue light, in a recessed portion of the circuit board, respectively positioning the nanocrystal-polymer composite films of Examples 3 and 2 to cover the Ag frame and the light emitting diode chip in the recessed portion of the circuit board, and then mixing pentaerythritol tetrakis (3-mercaptopropionate) as a first monomer and 1,3,5-triallyl-1,3,5-triazine-2,4,6(1H,3H,5H)-trione as a second monomer in a mole ratio of 3:4, adding 2 parts by weight of oxy-phenyl-acetic acid 2-[2-oxo-2-phenyl-acetoxy-ethoxy]-ethyl ester to 100 parts by weight of the first and second monomers, filling the mixture in the empty space of the recessed portion of the circuit board to cover the composite film, and curing the mixture at room temperature of 25° C. for 10 minutes.

The light emitting diodes of Examples 7, 8, 10, and 14, respectively, and the light emitting diodes of Comparative Examples 1 and 2 are operated with a current of 20 milli-Amperes (mA) and evaluated regarding luminous efficiency and photoconversion efficiency ("PCE") with respect to driving time. The PCE (%) is a value calculated as below:

the intensity in a light emitted by the nanocrystal/
(the intensity of the blank Blue LED chip–the
intensity of the LED device at the blue light
region)

Figure 7:
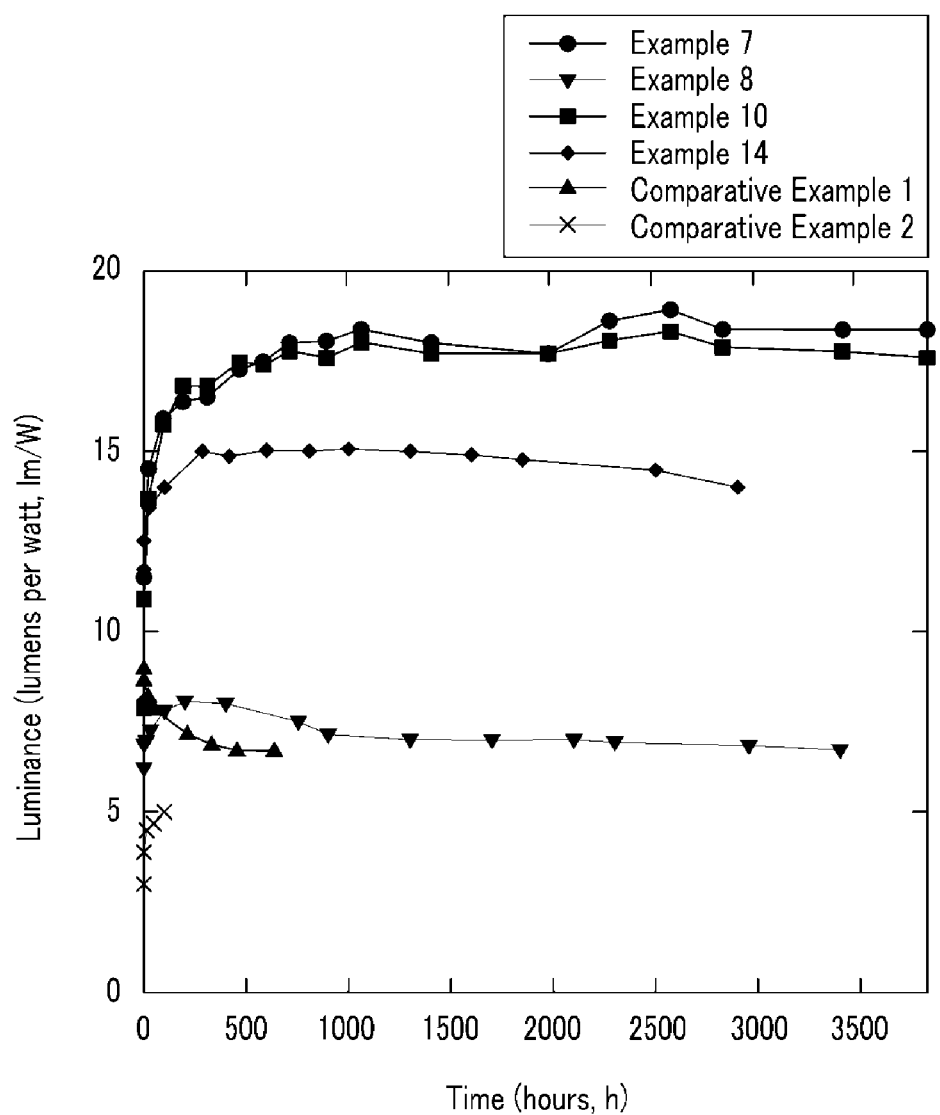
FIGS. 7 and 8 respectively show luminance (lumens per watt, lm/W) versus driving time (hours, h) and photoconversion efficiency ("PCE", percent, %) versus driving time (hours, h) of the light emitting diodes according to Examples 7, 8, 10, and 14, and Comparative Examples 1 and 2.
Figure 8:
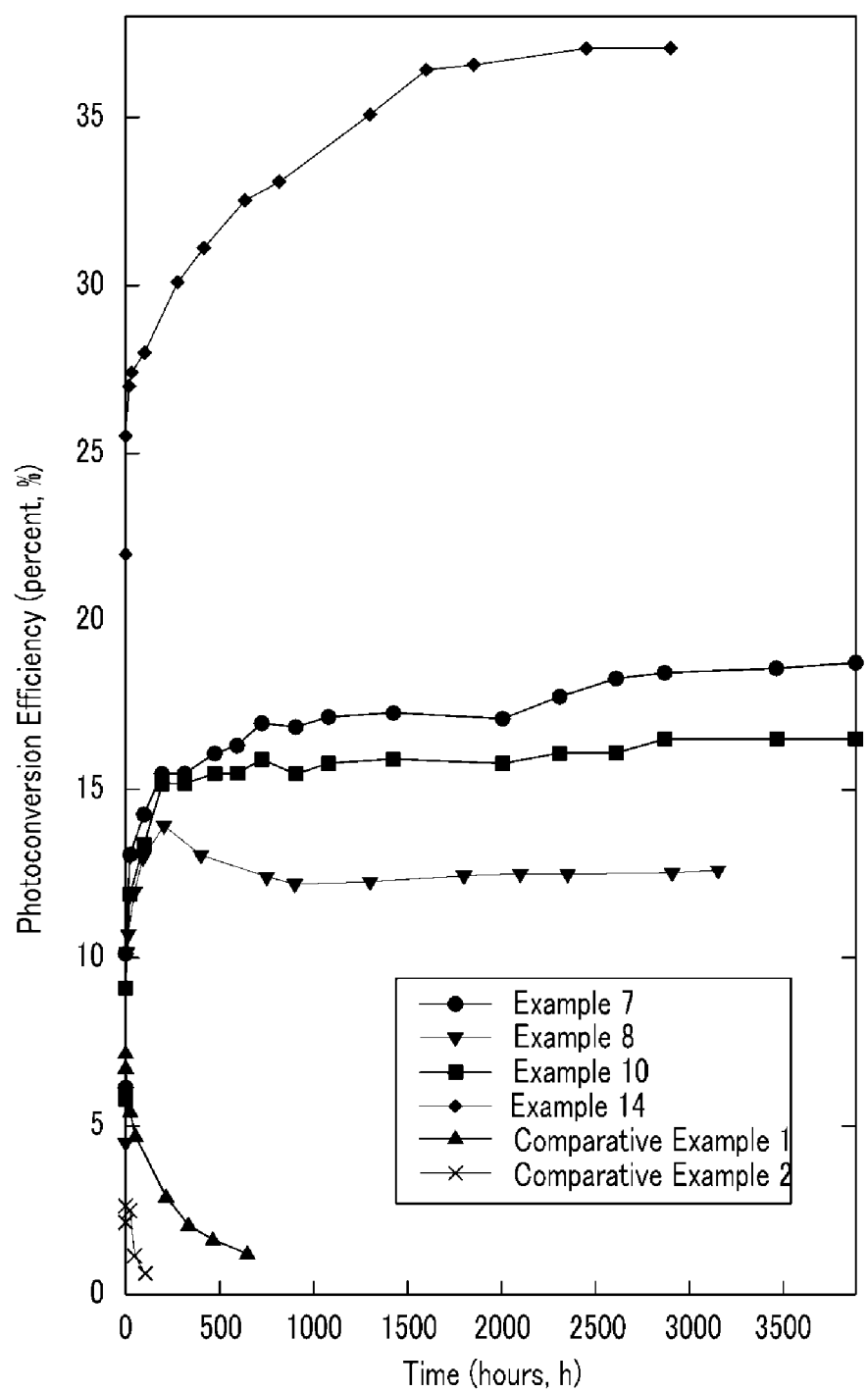

The results are provided in FIGS. 7 and 8, respectively. As shown in FIGS. 7 and 8, the light emitting diodes of Examples 7 and 10 provide excellent initial efficiency and life-span characteristics when compared with Comparative Example 1. Specifically they maintained the same efficiency for about 3800 hours or more. The light emitting diode according to Example 8 shows better initial efficiency and excellent life-span characteristics when compared with Comparative Example 2. Specifically it maintained the efficiency for about 3300 hours or more. The light emitting diode of Example 14 including the nanocrystal-polymer composites of Example 2 provided improved initial efficiency and excellent life-span characteristics, and maintained efficiency for 2800 hours or more.

Figure 9:
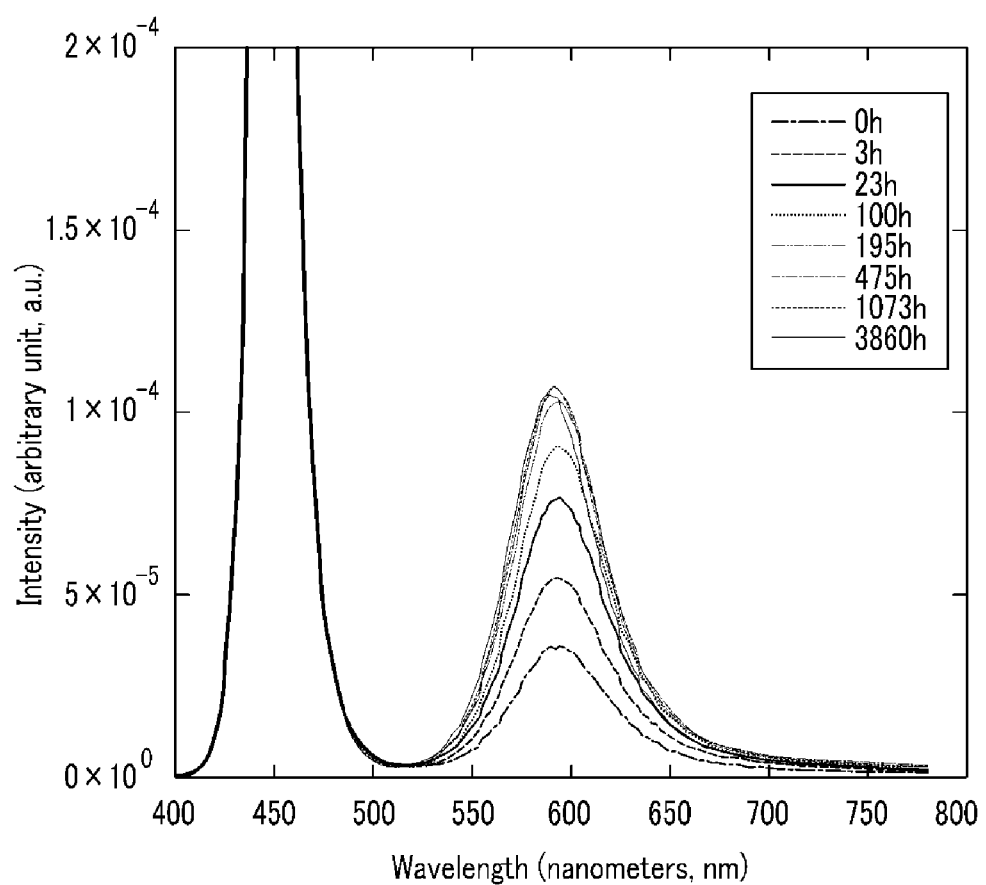
FIG. 9 is a graph of intensity (arbitrary units, a. u.) versus wavelength (nanometers, nm) and shows a light emitting peak of the light emitting diode according to Example 7.

FIG. 9 shows a light emitting peak of the light emitting diode according to Example 7. As shown in FIG. 9, it maintained the light emitting peak intensity for more than 3800 hours.

Example 15

Fabrication of a Light Emitting Diode ("LED")

Red InP/ZnSeS/ZnS nanocrystal is added to chloroform, preparing a solution having an OD of 0.035 when measured by diluting it by 100 times in toluene. A 30 microliter (μl) quantity of the solution is mixed with 0.11 g of pentaerythritol tetrakis(3-mercaptopropionate) as a first monomer and 0.077 g of 1,3,5-triallyl-1,3,5-triazine-2,4,6(1H,3H,5H)-trione as a second monomer. Then, the solvent is removed from the solution. 100 parts by weight of the first and second monomers is mixed with three parts by weight of oxy-phenyl-acetic acid 2-[2-oxo-2-phenyl-acetoxy-ethoxy]-ethyl ester, preparing a composition for a nanocrystal-polymer composite.

Then, a light emitting diode having a structure shown in FIG. 2 is fabricated by preparing a circuit board having a Ag frame and a light emitting diode chip, which emits 445 nm blue light, in a recessed portion of the circuit board, and coating the composition for a nanocrystal-polymer composite to cover the Ag frame and the light emitting diode chip in the recessed portion of the circuit board, and curing it by radiating UV.

Example 16

Fabrication of a Light Emitting Diode (LED)

Green InZnP/ZnSeS/ZnS nanocrystal is added to chloroform to prepare a solution having an OD of 0.042 when measured by diluting it by 100 times in toluene. A 0.1 ml quantity of the solution is mixed with 0.15 g of pentaerythritol tetrakis(3-mercaptopropionate) as a first monomer and 0.11 g of 1,3,5-triallyl-1,3,5-triazine-2,4,6(1H,3H,5H)-trione as a second monomer. Then, the solvent is removed from the mixture. Then, 1 part by weight of oxy-phenyl-acetic acid 2-[2-oxo-2-phenyl-acetoxy-ethoxy]-ethyl ester is mixed with 100 parts by weight of the first and second monomer mixture.

Next, a light emitting diode having a structure in FIG. 2 is fabricated by preparing a circuit board having a Ag frame and a light emitting diode chip, which emits 445 nm blue light, in a recessed portion of the circuit board, coating the composition to cover the Ag frame and the light emitting diode chip in the recessed portion of the circuit board, and curing the composition by radiating with UV light.

Example 17

Fabrication of a Light Emitting Diode ("LED")

Yellow InP/ZnS/InZnS/ZnS nanocrystal is coated with poly(ethylene-co-acrylic acid) including 5 wt % of an acrylic acid group having a Tm of 99-101° C. to prepare a nanocrystal powder coated with poly(ethylene-co-acrylic acid) on the surface. The nanocrystal is included in an amount of 18 wt % based on the total weight of the poly(ethylene-co-acrylic acid) and the nanocrystal.

The nanocrystal coated with poly(ethylene-co-acrylic acid) is mixed with a mixture of pentaerythritol tetrakis(3-mercaptopropionate) as a first monomer and 1,3,5-triallyl-1,3,5-triazine-2,4,6(1H,3H,5H)-trione as a second monomer mixed in a mole ratio of 3:4 to provide a mixture of the first and second monomers. Next, 1 part by weight of oxy-phenyl-acetic acid 2-[2-oxo-2-phenyl-acetoxy-ethoxy]-ethyl ester is mixed with 100 parts by weight of the mixture of the first and second monomers. Herein, the nanocrystal coated with the poly(ethylene-co-acrylic acid) is included in an amount of 0.77 parts by weight based on 100 parts by weight of pentaerythritol tetrakis(3-mercaptopropionate).

Next, a light emitting diode having a structure of FIG. 2 is fabricated by preparing a circuit board having a Ag frame and a light emitting diode chip, which emits 445 nm blue light, in a recessed portion of the circuit board, filling the mixture in the empty space of the recessed portion in the circuit board to cover the Ag frame and the light emitting diode chip therein, and curing it for 10 minutes at a room temperature of about 25° C.

Example 18

Fabrication of a Light Emitting Diode ("LED")

A light emitting diode is fabricated according to the same method as Example 17, except for using the nanocrystal coated with poly(ethylene-co-acrylic acid) in an amount of 2.5 parts by weight based on 100 parts by weight of pentaerythritol tetrakis(3-mercaptopropionate) (4T).

Example 19

Fabrication of a Light Emitting Diode ("LED")

Yellow InP/ZnS/InZnS/ZnS nanocrystal is coated with poly(ethylene-co-acrylic acid) including 5 wt % of an acrylic acid group having a Tm of 99-101° C. to prepare a nanocrystal-poly(ethylene-co-acrylic acid) film with a thickness of about 0.1 millimeter (mm). Herein, the yellow nanocrystal is included in an amount of 7 wt %, based on the total weight of the film.

Then, a light emitting diode having a structure of FIG. 2 is fabricated as follows. A circuit board is prepared having a Ag frame and a light emitting diode chip, which emits 445 nm blue light, in a recessed portion. The Ag frame and the light emitting diode chip in the recessed portion of the circuit board are covered with the nanocrystal-poly(ethylene-co-acrylic acid) film. Then, a mixture is prepared by mixing pentaerythritol tetrakis(3-mercaptopropionate) as a first monomer and 1,3,5-triallyl-1,3,5-triazine-2,4,6(1H,3H,5H)-trione as a second monomer in a mole ratio of 3:4, and adding 1 part by weight of oxy-phenyl-acetic acid 2-[2-oxo-2-phenyl-acetoxy-ethoxy]-ethyl ester thereto. The mixture is then filled in the empty space in the recessed portion of the circuit board and the nanocrystal-poly(ethylene-co-acrylic acid) film is cured at a room temperature of about 25° C. for 10 minutes.

Comparative Example 4

Fabrication of a Light Emitting Diode ("LED")

Yellow InP/ZnS/InZnS/ZnS nanocrystal is coated with poly(ethylene-co-acrylic acid) including 5 wt % of an acrylic acid group having a of =99-101° C., to prepare a nanocrystal-poly(ethylene-co-acrylic acid) film with a thickness of about 0.1 mm. The yellow nanocrystal is used in an amount of 7 wt %, based on the entire weight of the film.

The nanocrystal-poly(ethylene-co-acrylic acid) film is coated with an epoxy resin and then cured at 80° C. for 3 hours, preparing a matrix resin. The matrix resin is used to fabricate a light emitting diode.

Comparative Example 5

Fabrication of a Light Emitting Diode ("LED")

Red (InP/ZnSeS/ZnS) nanocrystals are added to chloroform to prepare a solution having an OD of 0.16 when measured by diluting the solution 100 times in toluene. 0.1 mL of the solution is mixed with 1 mL of epoxy resin (SJ-4000, SJC). Then, a light emitting diode was fabricated by obtaining a circuit board having an Ag frame and a light emitting diode chip, which emits 445 nm blue light, in a recessed portion of the circuit board, disposing the mixture of the nanocrystal and the epoxy resin to cover the Ag frame and the light emitting diode chip in the recessed portion of the circuit board, and curing the same at 120° C. for 90 min.

The luminance and photoconversion efficiency of the manufactured LED is measured in the same manner as for the LED of Example 14. The measured initial photoconversion efficiency of Comparative Example 5 is only 11%. In contrast, the measured initial PCE of Example 14 is about 22%, which was more than two times the PCE of the comparative Example 5 and even increased over time for at least 2,875 hours. Further, when the light emitting diode of Comparative Example 5 was operated with a current of 60 mA, the photoconversion efficiency decreased to 4% only after 170 hours operation.

Example 20

Fabrication of a Light Emitting Diode ("LED")

Red InP/ZnSeS/ZnS nanocrystal is coated with poly(ethylene-co-acrylic acid) including 5 wt % of an acrylic acid group having a Tm of 99-101° C., to prepare a nanocrystal powder coated with the poly(ethylene-co-acrylic acid) on the surface. The nanocrystal is included in an amount of about 11 wt %, based on the total weight of the poly (ethylene-co-acrylic acid) and the nanocrystal. Herein, the nanocrystal poly(ethylene-co-acrylic acid) is used in an amount of 1.1 parts by weight, based on 100 parts by weight of pentaerythritol tetrakis(3-mercaptopropionate).

Next, the pentaerythritol tetrakis(3-mercaptopropionate) as a first monomer and 1,3,5-triallyl-1,3,5-triazine-2,4,6(1H, 3H,5H)-trione as a second monomer are mixed in a mole ratio of 3:4. The mixture is mixed with the nanocrystal coated with the poly(ethylene-co-acrylic acid). Then, 1 part by weight of oxy-phenyl-acetic acid 2-[2-oxo-2-phenyl-acetoxy-ethoxy]-ethyl ester is added thereto based on 100 parts of weight of the first and second monomer mixture. Herein, the nanocrystal coated with poly(ethylene-co-acrylic acid) is used in an amount of 1.1 parts by weight, based on 100 parts by weight of pentaerythritol tetrakis(3-mercaptopropionate).

Then, a light emitting diode having a structure shown in FIG. 2 is fabricated by preparing a circuit board having a Ag frame and a light emitting diode chip, which emits 445 nm blue light, in a recessed portion, filling the mixture in the empty space in the recessed portion of the circuit board to cover the Ag frame and the light emitting diode chip in the recessed portion of the circuit board therein, and then curing it at a room temperature of about 25° C. for 10 minutes.

Example 21

Fabrication of a Light Emitting Diode ("LED")

Green InZnP/ZnSeS/ZnS nanocrystal is coated with poly (ethylene-co-acrylic acid) including 5 wt % of an acrylic acid group having a Tm of 99-101° C., to prepare a nanocrystal-poly(ethylene-co-acrylic acid) film with a thickness of about 0.1 mm. The green nanocrystal is included in an amount of 7 wt %, based on the entire weight of the film.

Next, a circuit board is prepared having a Ag frame and a light emitting diode chip, which emits 445 nm blue light, in a recessed portion. The nanocrystal-poly(ethylene-co-acrylic acid) film is positioned to cover the Ag frame and the light emitting diode chip in the recessed portion of the circuit board. Then, pentaerythritol tetrakis(3-mercaptopropionate) as a first monomer and 1,3,5-triallyl-1,3,5-triazine-2,4,6(1H,3H,5H)-trione as a second monomer are mixed in a mole ratio of 3:4. One part by weight of oxy-phenyl-acetic acid 2-[2-oxo-2-phenyl-acetoxy-ethoxy]-ethyl ester is added thereto based on 100 parts by weight of the first and second monomers. The mixture is filled to cover the empty space and the nanocrystal-poly(ethylene-co-acrylic acid) film in the recess portion of the circuit board and then cured at a room temperature of about 25° C. for about 10 minutes, fabricating a light emitting diode having a structure shown in FIG. 2.

Example 22

Fabrication of a Light Emitting Diode (LED)

Green InZnP/ZnSeS/ZnS nanocrystal is coated with poly(ethylene-co-acrylic acid) including 5 wt % of an acrylic acid group having a Tm of 99-101° C., to prepare a nanocrystal powder coated with the poly(ethylene-co-acrylic acid) on the surface. The nanocrystal is included in an amount of 7 wt %, based on the total weight of poly(ethylene-co-acrylic acid) and the nanocrystal.

Then, pentaerythritol tetrakis(3-mercaptopropionate) as a first monomer is mixed with 1,3,5-triallyl-1,3,5-triazine-2,4,6(1H,3H,5H)-trione as a second monomer in a mole ratio of about 3:4. The nanocrystal coated with poly(ethylene-co-acrylic acid) is added thereto. Then, 1 part by weight of oxy-phenyl-acetic acid 2-[2-oxo-2-phenyl-acetoxy-ethoxy]-ethyl ester is added thereto based on 100 parts by weight of the first and second monomers. Herein, the nanocrystal coated with poly(ethylene-co-acrylic acid) is included in an amount of 13 parts by weight based on 100 parts by weight of the pentaerythritol tetrakis(3-mercaptopropionate).

Then, a light emitting diode having a structure shown FIG. 2 is fabricated by preparing a circuit board having a Ag frame and a light emitting diode chip, which emits 445 nm blue light, in the recessed portion of the circuit board, filling the mixture to cover the Ag frame and the light emitting diode chip in the recessed portion of the circuit board and the empty space therein, and curing the mixture at a room temperature of about 25° C. for 10 minutes.

Example 23

Fabrication of a Light Emitting Diode ("LED")

Green InZnP/ZnSeS/ZnS nanocrystal is coated with poly(ethylene-co-acrylic acid) including 5 wt % of an acrylic acid group having a Tm of 99-101° C., to prepare a nanocrystal-poly(ethylene-co-acrylic acid) film with a thickness of about 0.1 mm. The green nanocrystal is included in an amount of 13 wt %, based on the total weight of the film.

Next, a circuit board is prepared to include a Ag frame and a light emitting diode, which emits 445 nm blue light, in a recessed portion. Then, a polydimethylsiloxane resin is filled in the recessed portion to cover the Ag frame and the light emitting diode and cured at 150° C. for 2 hours. The resulting product is covered with a glass plate. Then, pentaerythritol tetrakis(3-mercaptopropionate) as a first monomer and 1,3,5-triallyl-1,3,5-triazine-2,4,6(1H,3H,5H)-trione as a second monomer are mixed in a mole ratio of 3:4. One part by weight of oxy-phenyl-acetic acid 2-[2-oxo-2-phenyl-acetoxy-ethoxy]-ethyl ester is added thereto based on 100 parts by weight of the first and second monomers. The nanocrystal-poly(ethylene-co-acrylic acid) film is positioned on the glass plate, and the mixture is coated thereon and cured at a room temperature of about 25° C. for 10 minutes, fabricating a light emitting diode shown in FIG. 3.

The light emitting diodes according to Examples 15 and 17 to 22 are operated with a current of 20 mA. The light emitting diode of Example 23 is operated with a current of 60 mA. Luminous efficiency and PCE as a function of driving time are measured and the results are respectively provided in FIGS. 10 and 11.

Figure 10:
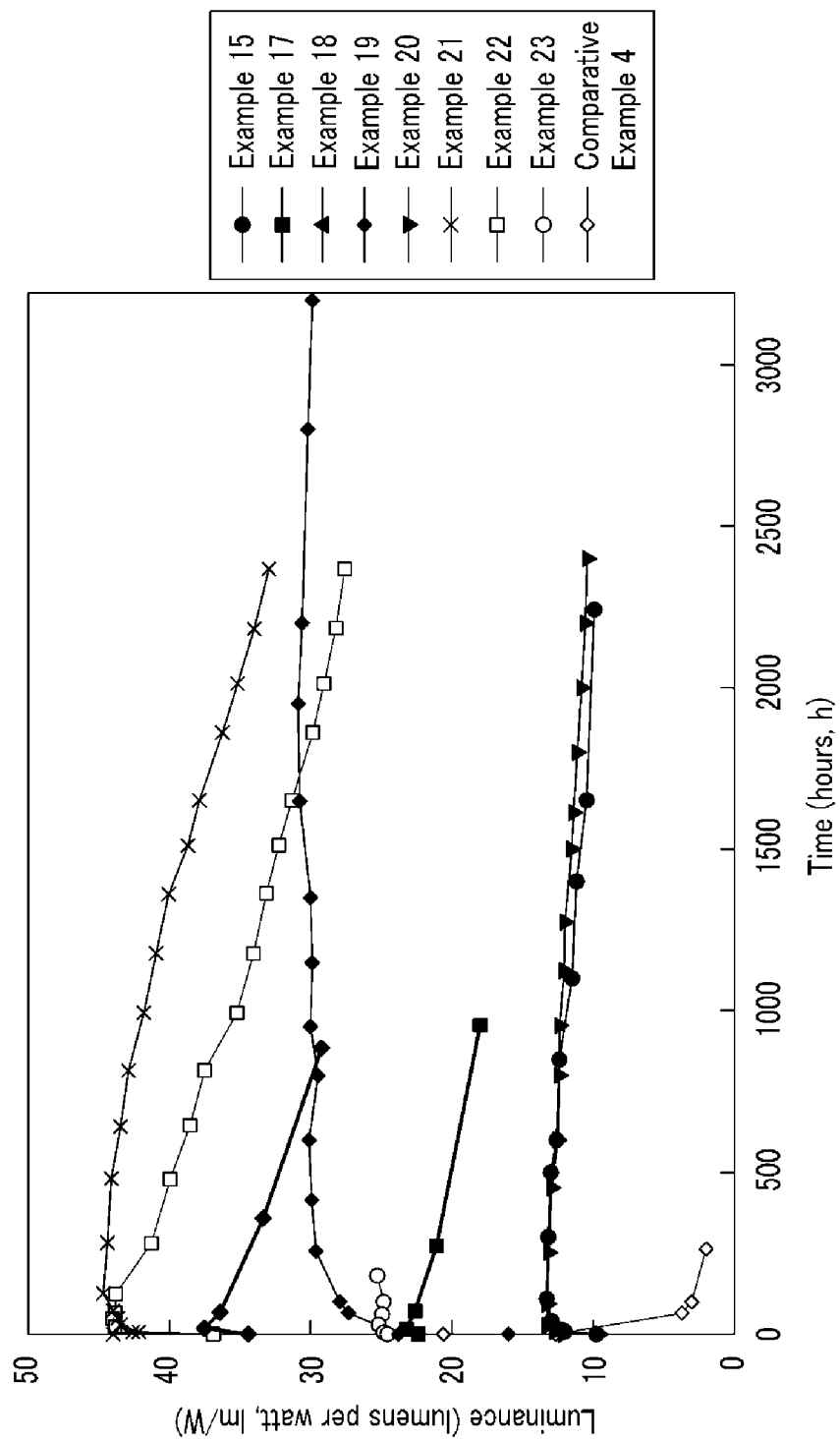
FIGS. 10 and 11 respectively show luminance (lumens per watt, lm/W) versus driving time (hours, h) and photo-conversion efficiency ("PCE", percent, %) versus time (hours, h) of the light emitting diode according to Examples 15, and 17 to 23.
Figure 11:
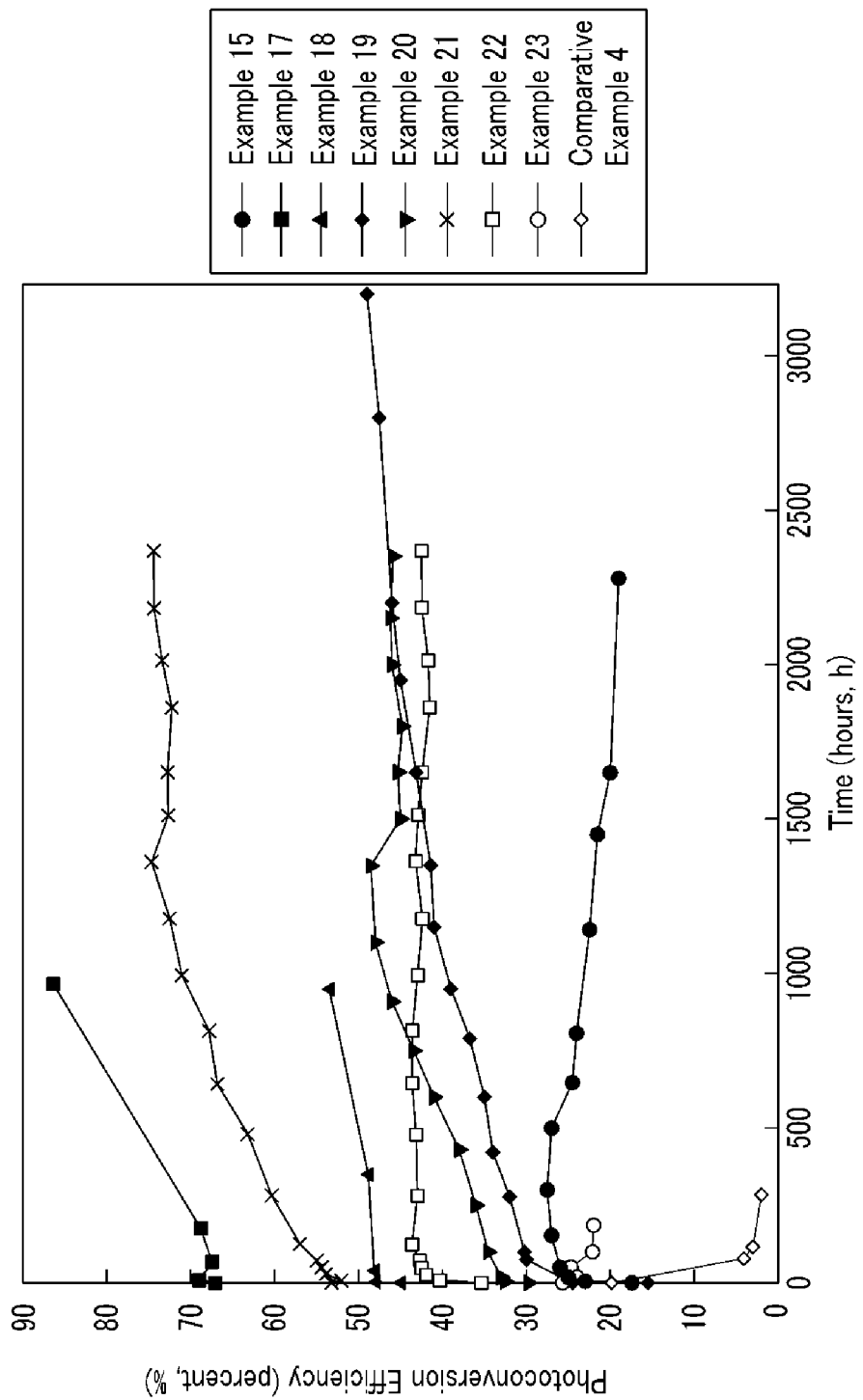

As illustrated in FIGS. 10 and 11, the light emitting diodes according to Example 15, 17, 18, and 20 provide excellent initial efficiency and an excellent life-span characteristic, including stable efficiency for about 2300 hours or more.

The light emitting diodes according to Example 19 provide excellent initial efficiency and life-span characteristics when compared with Comparative Example 4.

The light emitting diodes according to Examples 21 to 22 including nanocrystal coated with poly(ethylene-co-acrylic acid) provide excellent initial efficiency and life-span characteristics.

In particular, the light emitting diode according to Example 23 provides excellent initial efficiency and life-span characteristics at a high current.

Example 24

Fabrication of a Light Emitting Diode ("LED")

Green (InPZnS/ZnSeS/ZnS) nanocrystals are coated with poly(ethylene-co-acrylic acid) including 5 wt % of an acrylic acid group having a $T_m$ of 99-101° C. to prepare a nanocrystal powder coated with poly(ethylene-co-acrylic acid) on the surface. The nanocrystals are included in an amount of 7.5 wt % based on the total weight of the poly(ethylene-co-acrylic acid) and the nanocrystal. The nanocrystal coated with poly(ethylene-co-acrylic acid) is mixed with a mixture of pentaerythritol tetrakis(3-mercaptopropionate) as a first monomer and 1,3,5-triallyl-1,3,5-triazine-2,4,6(1H,3H,5H)-trione as a second monomer mixed in a mole ratio of 3:4 to provide a mixture of the first and second monomers. Next, 1 part by weight of oxy-phenyl-acetic acid 2-[2-oxo-2-phenyl-acetoxy-ethoxy]-ethyl ester is mixed with 100 parts by weight of the mixture of the first and second monomers and the mixture was cured at a room temperature of about 25° C. for 10 minutes to prepare a nanocrystal-polymer composite. Herein, the nanocrystal coated with the poly(ethylene-co-acrylic acid) is included in an amount of 2.65 parts by weight based on 100 parts by weight of pentaerythritol tetrakis(3-mercaptopropionate).

The nanocrystal-polymer composite prepared above is positioned to cover the Ag frame and the light emitting diode chip in the recessed portion of the circuit board. Then, trimethylolpropane tris(3-mercaptopropionate) as a first monomer having three thiol groups and 1,3,5-triallyl-1,3,5-triazine-2,4,6(1H,3H,5H)-trione as a second monomer were mixed in a mole ratio of 1:1. One part by weight of oxy-phenyl-acetic acid 2-[2-oxo-2-phenyl-acetoxy-ethoxy]-ethyl ester is added thereto based on 100 parts by weight of the first and second monomers. The mixture is filled to cover the empty space and the nanocrystal-polymer composite in polymer film in the recess portion of the circuit board and then cured at a room temperature of about 25° C. for about 10 minutes.

The luminance and the photoconversion efficiency of the manufactured LED are measured as in the aforementioned way. Initially measured luminance and photoconversion efficiency of the LEDs manufactured in Example 24 are shown in the following table 1.

Example 25

Fabrication of a Light Emitting Diode ("LED")

The nanocrystal-polymer composite prepared in Example 24 is positioned to cover the Ag frame and the light emitting diode chip in the recessed portion of the circuit board. Then, pentaerythritol tetrakis(3-mercaptopropionate) as a first monomer having four thiol groups and 1,3,5-triallyl-1,3,5-triazine-2,4,6(1H,3H,5H)-trione as a second monomer were mixed in a mole ratio of 3:4. One part by weight of oxy-phenyl-acetic acid 2-[2-oxo-2-phenyl-acetoxy-ethoxy]-ethyl ester is added thereto based on 100 parts by weight of the first and second monomers. The mixture is filled to cover the empty space and the nanocrystal-polymer composite in polymer film in the recess portion of the circuit board and then cured at a room temperature of about 25° C. for about 10 minutes.

The luminance and the photoconversion efficiency of the manufactured LED are measured as in the aforementioned way. Initially measured luminance and photoconversion efficiency of the LEDs manufactured in Example 25 are shown in the following table 1.

Comparative Example 6

Fabrication of a Light Emitting Diode ("LED")

green(InPZnS/ZnSeS/ZnS) nanocrystals are coated with poly(ethylene-co-acrylic acid) including 5 wt % of an acrylic acid group having a $T_m$ of 99-101° C. to prepare a nanocrystal powder coated with poly(ethylene-co-acrylic acid) on the surface. The nanocrystals are included in an amount of 7.5 wt % based on the total weight of the poly(ethylene-co-acrylic acid) and the nanocrystal. The nanocrystal coated with poly(ethylene-co-acrylic acid) is mixed with epoxy resin. Then, a light emitting diode is fabricated by obtaining a circuit board having an Ag frame and a light emitting diode chip, which emits 445 nm blue light, in a recessed portion of the circuit board, disposing the mixture of the nanocrystal and the epoxy resin to cover the Ag frame and the light emitting diode chip in the recessed portion of the circuit board, and the mixture is cured at 80° C. for 2 hours and 100° C. for 2 hours.

The luminance and the photoconversion efficiency of the manufactured LED are measured in the aforementioned way. Initially measured luminance and photoconversion efficiency of the LEDs manufactured in Comparative Example 6 are shown in the following table 1.

TABLE 1

| Resin | lm/w | PCE (%) |
| --- | --- | --- |
| Example 24 (3T-TTT) | 32.5 | 42.4 |
| Example 25 (4T-TTT) | 33.3 | 40.1 |
| Comparative Example 6 (epoxy) | 17.5 | 18.1 |

The results confirm that the LEDs of Examples 24 and 25 have significantly (e.g., at least two times) higher luminance and photoconversion efficiency, which are significantly higher than the LED of Comparative Example 6. The LEDs of Examples 24 and 25 are subjected to a long term reliability test by operating the LEDs with a current of 20 mA and the results confirm that they maintained the high level of luminance and photoconversion efficiency for a long time (e.g., for at least 2,000 hours).

Example 26

Fabrication of a Light Emitting Diode ("LED")

Red (InP/ZnSeS/ZnS) nanocrystals are coated with poly (ethylene-co-acrylic acid) including 5 wt % of an acrylic acid group having a $T_m$ of 99-101° C. to prepare a nanocrystal-poly(ethylene-co-acrylic acid) film with a thickness of about 0.05 millimeter (mm). Herein, the red nanocrystal is included in an amount of 4.5 wt %, based on the total weight of the film.

The nanocrystal-polymer composite in the polymer film thus obtained is positioned to cover the Ag frame and the light emitting diode chip in the recessed portion of the circuit board. Then, tris[2-(3-mercaptopropionyloxy)ethyl]isocyanurate having three thiol groups as a first monomer and 1,3,5-triallyl-1,3,5-triazine-2,4,6(1H,3H,5H)-trione as a second monomer are mixed in a mole ratio of 1:1. One part by weight of oxy-phenyl-acetic acid 2-[2-oxo-2-phenyl-acetoxy-ethoxy]-ethyl ester is added thereto based on 100 parts by weight of the first and second monomers to obtain a final mixture. The empty space in the recessed portion of the circuit board including the nanocrystal-polymer composite is filled with the final mixture and then cured at a room temperature of about 25° C. for about 10 minutes.

The luminance and the photoconversion efficiency of the manufactured LED are measured. The long term tests are conducted by operating the LED with a current of 20 mA to measure the luminance and the photoconversion efficiency over time. The results confirm that the initial luminance and the photoconversion efficiency of the LED thus prepared are relatively high and increased as the LED was operated, and such an increased value was maintained for about at least 1800 hours.

Example 27

Fabrication of a Light Emitting Diode ("LED")

Red (InP/ZnS/ZnS) nanocrystals are added to chloroform to prepare a nanocrystal solution having an OD of 0.058 when measured by diluting it by 100 times in toluene. 34 μL of the nanocrystal solution is mixed with a mixture of 0.1254 g of pentaerythritol tetrakis (3-mercaptopropionate) as a first monomer and 0.0865 g of 1,3,5-triallyl-1,3,5-triazine-2,4,6 (1H,3H,5H)-trione as a second monomer and 0.0044 g of Irgacure 754 as initiator. Then, the solvent is removed from the solution to obtain a composition. Then, a light emitting diode is fabricated by obtaining a circuit board having an Ag frame and a light emitting diode chip, which emits 449 nm blue light, in a recessed portion of the circuit board; disposing the composition to cover the Ag frame and the light emitting diode chip in the recessed portion of the circuit board; and curing the same by radiating UV at a room temperature of about 25° C. for 2 minutes.

The luminance and the photoconversion efficiency of the manufactured LED are measured as the LED is operated with a current of 20 mA. The initially measured luminance and photoconversion efficiency of the LEDs manufactured in Example 27 are shown in the following table 2.

Example 28

Fabrication of a Light Emitting Diode ("LED")

Red (InP/ZnS/ZnS) nanocrystals are added to chloroform to prepare a nanocrystal solution having an OD of 0.058 when measured by diluting it by 100 times in toluene. 16 μL of the nanocrystal solution is mixed with a mixture of 0.035 g of pentaerythritol tetrakis (3-mercaptopropionate) as a first monomer, 0.065 g of tricyclodecane dimethanol diacrylate as a second monomer, and 0.001 g of Irgacure 184 and 0.001 g of Darocur TPO as an initiator. Then, the solvent is removed from the solution to obtain a composition. Then, a light emitting diode is fabricated by obtaining a circuit board having an Ag frame and a light emitting diode chip, which emits 449 nm blue light, in a recessed portion of the circuit board; disposing the composition to cover the Ag frame and the light emitting diode chip in the recessed portion of the circuit board; and curing the same by radiating UV at a room temperature of about 25° C. for 2 minutes.

The luminance and the photoconversion efficiency of the manufactured LED are measured as the LED is operated with a current of 20 mA. The Initially measured luminance and photoconversion efficiency of the LEDs manufactured in Example 28 are shown in the following table 2.

Comparative Example 7

Fabrication of a Light Emitting Diode ("LED")

Red (InP/ZnS/ZnS) nanocrystals are added to trioctylphosphine to prepare a nanocrystal solution having an OD of 0.048 when measured by diluting it by 100 times in toluene. 208 μL of the nanocrystal solution was mixed with a mixture of 650 μL lauryl methacrylate and 350 μL of 1,6-hexanediol dimethacrylate, 0.01 g of azobisisobutyronitrile to obtain a composition. Then, a light emitting diode was fabricated by obtaining a circuit board having an Ag frame and a light emitting diode chip, which emits 449 nm blue light, in a recessed portion of the circuit board, disposing the composition to cover the Ag frame and the light emitting diode chip in the recessed portion of the circuit board, and curing the same at 80° C. for 2 hours.

The luminance and the photoconversion efficiency of the manufactured LED are measured as the LED is operated with a current of 20 mA. The Initially measured luminance and photoconversion efficiency of the LEDs manufactured in Comparative Example 7 are shown in the following table 2.

TABLE 2

|  | Example 27 | Example 28 | Comparative Example 7 |
|---|---|---|---|
| lm/w | 15.5 | 15.8 | 9.59 |
| PCE (%) | 52.15 | 70.72 | 11.91 |

The results in the above table show that the LED of Examples 27 and 28 has luminance that was significantly higher than the LED of Comparative Example 7. In addition, the LED of Examples 27 and 28 has photo-conversion efficiency that is at least about five to seven times higher than that of the LED of Comparative Example 7.

Fabrication of LEDs

Example 29

Red (InP/ZnSeS/ZnS) nanocrystal is added to toluene to prepare a QD solution having an optical density (OD) of 0.159 as measured by diluting it by 100 times in toluene. A 31.4 mg of the QD solution is mixed with a mixture of 297.5 mg of pentaerythritol tetrakis(3-mercaptopropionate) as a first monomer and 202.5 mg of 1,3,5-triallyl-1,3,5-triazine-2,4,6(1H,3H,5H)-trione as a second monomer and 5 mg of Irgacure 754 as initiator. Then, the solvent is removed therefrom to obtain a QD composition including the red (InP/ZnSeS/ZnS) nanocrystal.

Then, the QD-monomer composition is disposed in a recessed portion of a circuit board having a Ag frame and a home-made, blue-light emitting diode chip, which emits 450 nm light, to cover the Ag frame and the Blue LED chip, and the resulting product is cured by UV irradiation at a room temperature of about 25° C. for 2 minutes to obtain a light emitting diode.

Example 30

Red (InP/ZnSeS/ZnS) nanocrystal is added to lauryl methacrylate to prepare a QD solution having an OD of 0.0752 as measured by diluting it by 100 times in toluene. A 66.5 mg of the QD solution is mixed with a mixture of 150 mg of pentaerythritol tetrakis (3-mercaptopropionate) as a first monomer and 275 mg of tricyclodecane dimethanol diacrylate as a second monomer and 8.5 mg of lauryl methacrylate as a fourth monomer and 2.5 mg of Irgacure 184 and 2.5 mg of Darocur TPO as initiator to obtain a QD composition including the red (InP/ZnSeS/ZnS) nanocrystal in substantially the same amount as that of Example 29. The value of OD x the amount of the QD solution (mg) (0.0752× 66.5 mg=about 5) in this example was found to be substantially the same as that of Example 29 (0.159×31.4 mg=about 5).

Then, a light emitting diode is prepared in the same manner described in Example 29 except for using a QD composition prepared as above.

Comparative Example 8

Red (InP/ZnSeS/ZnS) nanocrystal is added to trioctylphosphine to prepare a solution having an OD of 0.153 when measured by diluting it by 100 times in toluene. A 32.7 mg of the solution is mixed with a mixture of 292.3 mg of lauryl methacrylate and 175 mg of 1,6-hexanediol dimethacrylate, 5 mg of azobisisobutyronitrile to obtain a QD composition including the red (InP/ZnSeS/ZnS) nanocrystal in substantially the same amount as that of Example 29. The value of OD x the amount of the QD solution (mg) (0.153×32.7 mg=about 5) in this example was found to be substantially the same as that of Example 29 (0.159×31.4 mg=about 5).

Then, a light emitting diode is prepared in the same manner described in Example 29 except that a QD composition prepared as above is used and curing is conducted at 70° C. for 2 hours.

Comparative Example 9

Red (InP/ZnSeS/ZnS) nanocrystal is added to toluene to prepare a solution having an OD of 0.159 when measured by diluting it by 100 times in toluene. A 31.4 mg of the QD solution is mixed with a mixture of 500 mg of CN9178 (urethane acrylate, purchased from Sartomer) and 2.5 mg of Irgacure 184 and 2.5 mg of Darocur TPO as initiator. Then, the solvent is removed therefrom to obtain a QD composition including the red (InP/ZnSeS/ZnS) nanocrystal in substantially the same amount as that of Example 29. The value of OD x the amount of the QD solution (mg) (0.159×31.4 mg=about 5) in this example was found to be substantially the same as that of Example 29 (0.159×31.4 mg=about 5).

Then, a light emitting diode is prepared in the same manner described in Example 29 except that a QD composition prepared as above is used.

Evaluation of the LEDs prepared in Examples 29 and 30 and Comparative Examples 8 and 9

The intensity of the light emitted by the LEDs prepared in Examples 29 and 30 and Comparative Examples 8 and 9 was tested. All devices were operated at 20 mA to obtain a luminance value set forth in Table 4 and the spectra are shown in FIG. 12 and FIG. 13. From the spectrums of FIG. 13, the PCE (%) is calculated and compiled in Table 3.

TABLE 3

|  | Example 29 | Example 30 | Comp. Example 8 | Comp. Example 9 |
| --- | --- | --- | --- | --- |
| lm/w | 11.9 | 13.1 | 5.82 | 6.26 |
| PCE (%) | 40.3 | 39.8 | 1.9 | 3.2 |

The results of the above table clearly showed that the LEDs manufactured in Examples 29 and 30 have luminance that is significantly higher (more than two times) than the LED prepared in Comparative Examples 8 and 9. In addition, the LEDs manufactured in Examples 29 and 30 have photo-conversion efficiency that is at least about 10 times or even 20 times higher than that of the LEDs prepared in Comparative Examples 8 and 9.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A composition comprising:
a first monomer including at least three thiol groups, each located at a terminal end of the first monomer, wherein the first monomer is represented by the following Chemical Formula 1-1:

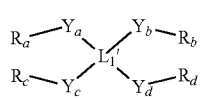

Chemical Formula 1-1 wherein, in Chemical Formula 1-1, $L_1'$ is carbon, a substituted or unsubstituted C6 to C30 arylene group, a substituted or a unsubstituted C3 to C30 heteroarylene group, a substituted or unsubstituted C3 to C30 cycloalkylene group, or a substituted or unsubstituted C3 to C30 heterocycloalkylene group;

each of $Y_a$ to $Y_d$ is independently a direct bond, a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by sulfonyl, carbonyl, ether, sulfide, sulfoxide, ester, amide of formula —C(=O)NR— wherein R is hydrogen or a C1 to C10 alkyl group, imine of formula —NR— wherein R is hydrogen or a C1 to C10 alkyl group, or a combination thereof; and $R_a$ to $R_d$ are $R^1$ or —SH, provided that at least three of $R_a$ to $R_d$ are —SH and $R^1$ is hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a hydroxyl group, —NH$_2$, a substituted or unsubstituted C1 to C30 amine group of formula —NRR' wherein R and R' are each independently hydrogen or a C1 to C30 alkyl group, an isocyanate group, an isocyanurate group, a (meth)acrylate group, a halogen, —ROR' wherein R is a substituted or unsubstituted C1 to C20 alkylene group and R' is hydrogen or a C1 to C20 alkyl group, an acyl halide of formula —RC(O)X wherein R is a substituted or unsubstituted alkylene group and X is a halogen, —C(=O)OR' wherein R' is hydrogen or a C1 to C20 alkyl group, —CN, or —C(=O)ONRR' wherein R and R' are each independently hydrogen or a C1 to C20 alkyl group;

a second monomer including at least two unsaturated carbon-carbon bonds, each located at a terminal end of the second monomer, wherein the second monomer is represented by the following Chemical Formula 2:

Chemical Formula 2 wherein, in Chemical Formula 2,

X is an acrylate group, a methacrylate group, a C2 to C30 alkenyl group, a C2 to C30 alkynyl group, a substituted or unsubstituted C3 to C30 alicyclic group including a ring having a double bond or a triple bond in the ring, a substituted or unsubstituted C3 to C30 heterocycloalkyl group including a ring having a double bond or a triple bond in the ring, a C3 to C30 alicyclic group substituted with a C2 to C30 alkenyl group or a C2 to C30 alkynyl group, a C3 to C30 heterocycloalkyl group substituted with a C2 to C30 alkenyl group or a C2 to C30 alkynyl group, or a combination thereof;

$R^2$ is hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a hydroxy group, —NH$_2$, a substituted or unsubstituted C1 to C30 amine group of formula —NRR' wherein R and R' are each independently hydrogen or a C1 to C30 alkyl group, an isocyanate group, an isocyanurate group, a (meth)acrylate group, a halogen, —ROR' wherein R is a substituted or unsubstituted C1 to C20 alkylene group and R' is hydrogen or a C1 to C20 alkyl group, an acyl halide of formula —RC(O)X wherein R is a substituted or unsubstituted alkylene group and X is a halogen, —C(=O)OR' wherein R' is hydrogen or a C1 to C20 alkyl group, —CN, or —C(=O)ONRR' wherein R and R' are each independently hydrogen or a C1 to C20 alkyl group;

$L_2$ is a single bond, a substituted or unsubstituted C1 to C30 alkylene group, a substituted or unsubstituted C6 to C30 arylene group, or a substituted or unsubstituted C3 to C30 heteroarylene group;

Y$_2$ is a single bond; or a substituted or unsubstituted C1 to C30 alkylene group; or a C1 to C30 alkylene group wherein at least one methylene group is replaced by a sulfonyl, a carbonyl, an ether, a sulfide, a sulfoxide, an ester, an amide of formula —C(=O)NR— wherein R is hydrogen or a C1 to C10 alkyl group, an imine of formula —NR— wherein R is hydrogen or a C1 to C10 alkyl group, or a combination thereof;

n is an integer of 1 or more;

k3 is an integer of 0 or 1 or more;

k4 is an integer of 1 or more;

the sum of n and k4 is an integer of 3 or more;

n does not exceed the valance of Y$_2$; and k3 and k4 does not exceed the valence of the L$_2$; and a light emitting particle, wherein the light emitting particle consists of a semiconductor nanocrystal comprising a Group II-VI compound, a Group III-V compound, or a combination thereof, wherein the light emitting particle has a core/shell structure having a first semiconductor nanocrystal being surrounded by a second semiconductor nanocrystal, and the first semiconductor nanocrystal being different from the second semiconductor nanocrystal, wherein the Group II-VI compound comprises a binary compound selected from CdSe, CdTe, ZnS, ZnSe, ZnTe, HgS, HgSe, HgTe, MgSe, MgS, and a combination thereof, or a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, or wherein the Group III-V compound comprises a binary compound selected from GaN, GaP, GaAs, GaSb, AlN, AlP, AlAs, AlSb, InN, InP, InAs, InSb, and a combination thereof, or a ternary compound selected from GaNP, GaNAs, GaNSb, GaPAs, GaPSb, AlNP, AlNAs, AlNSb, AlPAs, AlPSb, InNP, InZnP, InNAs, InNSb, InPAs, InPSb, and a combination thereof.

2. The composition of claim 1, wherein the first monomer of the above Chemical Formula 1 comprises the compounds of the following Chemical Formulas 1-2 to 1-5:

Chemical Formula 1-2

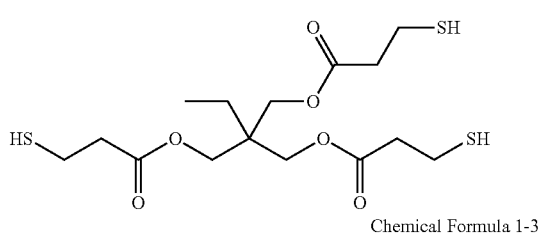

Chemical Formula 1-3

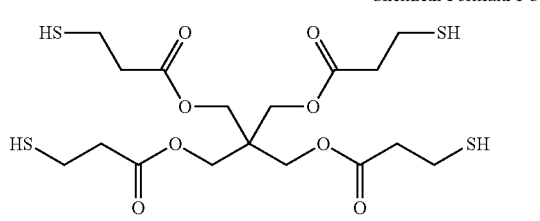

Chemical Formula 1-4

![Chemical Formula 1-4]

Chemical Formula 1-5

![Chemical Formula 1-5]

3. The composition of claim 1, wherein in Chemical Formula 2, X is an acrylate group, a methacrylate group, or a C2 to C30 alkenyl group.

4. The composition of claim 1, wherein in Chemical Formula 2, L$_2$ is a pyrrolidine group, a tetrahydrofuran group, a pyridine group, a pyrimidine group, a piperidine group, a triazine group, or an isocyanurate group.

5. The composition of claim 1, wherein the second monomer of the above Chemical Formula 2 comprises the compounds of the following Chemical Formula 2-1 and Chemical Formula 2-2:

Chemical Formula 2-1

![Chemical Formula 2-1 triazine structure with Z1, Z2, Z3]

Chemical Formula 2-2

![Chemical Formula 2-2 isocyanurate structure with Z1, Z2, Z3]

wherein, in Chemical Formulas 2-1 and 2-2, Z$_1$ to Z$_3$ are the same or different, and correspond to —[Y$_2$—X$_n$] of Chemical Formula 2.

6. The composition of claim 1, wherein the second monomer comprises the compounds of the following Chemical Formulas 2-3 to 2-5:

Chemical Formula 2-3

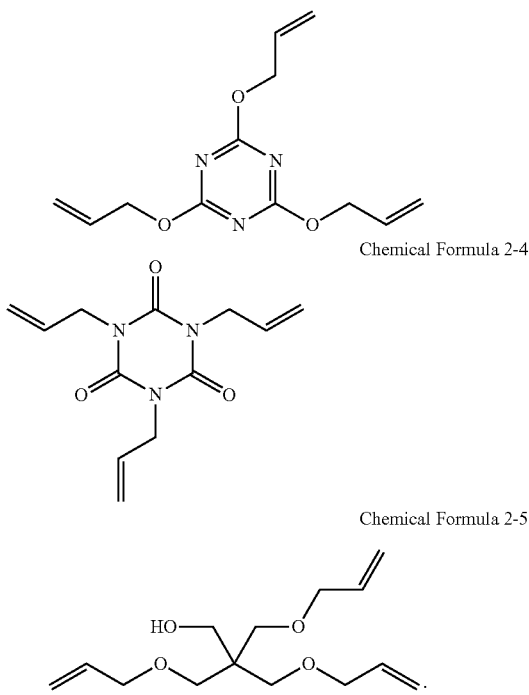

Chemical Formula 2-4

Chemical Formula 2-5

7. The composition claim 1, wherein the first monomer and the second monomer are present in combination in an amount of about 80 to about 99.9 weight percent, based on the total weight of the composition for a light emitting particle-polymer composite.

8. The composition claim 1, wherein the thiol groups of the first monomer and the unsaturated carbon-carbon bonds of the second monomer are present in a mole ratio of 1:about 0.75 to 1:about 1.25.

9. The composition claim 1, further comprising
a third monomer having one thiol group located at a terminal end of the third monomer,
a fourth monomer having an unsaturated carbon-carbon bond located at a terminal end of the fourth monomer, or
a combination thereof.

10. The composition claim 1,
wherein the second monomer comprises a compound represented by Chemical Formula 2-6:

Chemical Formula 2-6

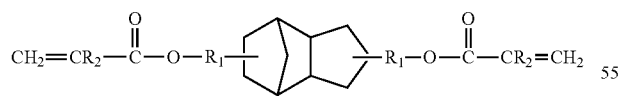

wherein, in Chemical Formula 2-6,
$R_1$ is a C1 to C20 alkylene group, or a substituted C1 to C20 alkylene group wherein at least one methylene group is replaced by —C(=O)—, —O—, —C(=O)O—, or a combination thereof, and
$R_2$ is hydrogen or a methyl group.

11. A composite comprising a polymerization product of the composition of claim 1.

12. An optoelectronic device comprising the composite according to claim 11.

13. A composition comprising:
a first monomer comprising at least three thiol groups, each located at a terminal end of the first monomer, wherein the first monomer is represented by the following Chemical Formula 1-1:

Chemical Formula 1-1

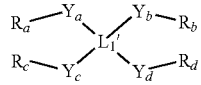

wherein, in Chemical Formula 1-1, $L_1'$ is carbon, a substituted or unsubstituted C6 to C30 arylene group, a substituted or a unsubstituted C3 to C30 heteroarylene group, a substituted or unsubstituted C3 to C30 cycloalkylene group, or a substituted or unsubstituted C3 to C30 heterocycloalkylene group;
each of $Y_a$ to $Y_d$ is independently a direct bond, a substituted or unsubstituted C1 to C30 alkylene group; a substituted or unsubstituted C2 to C30 alkenylene group; or a C1 to C30 alkylene group or a C2 to C30 alkenylene group wherein at least one methylene group is replaced by sulfonyl, carbonyl, ether, sulfide, sulfoxide, ester, amide of formula —C(=O)NR— wherein R is hydrogen or a C1 to C10 alkyl group, imine of formula —NR— wherein R is hydrogen or a C1 to C10 alkyl group, or a combination thereof; and
$R_a$ to $R_d$ are $R^1$ or —SH, provided that at least three of $R_a$ to $R_d$ are —SH and
$R^1$ is hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a hydroxyl group, —NH₂, a substituted or unsubstituted C1 to C30 amine group of formula —NRR' wherein R and R' are each independently hydrogen or a C1 to C30 alkyl group, an isocyanate group, an isocyanurate group, a (meth)acrylate group, a halogen, —ROR' wherein R is a substituted or unsubstituted C1 to C20 alkylene group and R' is hydrogen or a C to C20 alkyl group, an acyl halide of formula —RC(O)X wherein R is a substituted or unsubstituted alkylene group and X is a halogen, —C(=O)OR' wherein R' is hydrogen or a C1 to C20 alkyl group, —CN, or —C(=O)ONRR' wherein R and R' are each independently hydrogen or a C1 to C20 alkyl group;
a second monomer comprising at least two unsaturated carbon-carbon bonds, each located at a terminal end of the second monomer, wherein the second monomer is represented by the following Chemical Formula 2:

Chemical Formula 2

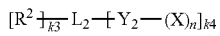

wherein, in Chemical Formula 2,
X is an acrylate group, a methacrylate group, a C2 to C30 alkenyl group, a C2 to C30 alkynyl group, a substituted or unsubstituted C3 to C30 alicyclic group comprising a ring having a double bond or a triple bond in the ring, a substituted or unsubstituted C3 to C30 heterocycloalkyl group comprising a ring having a double bond or a triple bond in the ring, a C3 to C30 alicyclic group substituted with a C2 to C30 alkenyl group or a C2 to C30 alkynyl group, a C3 to C30 heterocycloalkyl group substituted with a C2 to C30 alkenyl group or a C2 to C30 alkynyl group, or a combination thereof;

R² is hydrogen, a substituted or unsubstituted C1 to C30 alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a hydroxy group, —NH₂, a substituted or unsubstituted C1 to C30 amine group of formula —NRR' wherein R and R' are each independently hydrogen or a C1 to C30 alkyl group, an isocyanate group, an isocyanurate group, a (meth)acrylate group, a halogen, —ROR' wherein R is a substituted or unsubstituted C1 to C20 alkylene group and R' is hydrogen or a C1 to C20 alkyl group, an acyl halide of formula —RC(O)X wherein R is a substituted or unsubstituted alkylene group and X is a halogen, —C(=O)OR' wherein R' is hydrogen or a C1 to C20 alkyl group, —CN, or —C(=O)ONRR' wherein R and R' are each independently hydrogen or a C1 to C20 alkyl group;

L₂ is a single bond, a substituted or unsubstituted C1 to C30 alkylene group, a substituted or unsubstituted C6 to C30 arylene group, or a substituted or unsubstituted C3 to C30 heteroarylene group;

Y₂ is a single bond; or a substituted or unsubstituted C1 to C30 alkylene group; or a C1 to C30 alkylene group wherein at least one methylene group is replaced by a sulfonyl, a carbonyl, an ether, a sulfide, a sulfoxide, an ester, an amide of formula —C(=O)NR— wherein R is hydrogen or a C1 to C10 alkyl group, an imine of formula —NR— wherein R is hydrogen or a C1 to C10 alkyl group, or a combination thereof;

n is an integer of 1 or more;
k3 is an integer of 0 or 1 or more;
k4 is an integer of 1 or more;
the sum of n and k4 is an integer of 3 or more;
n does not exceed the valance of Y₂; and
k3 and k4 does not exceed the valence of the L₂; and
a light emitting particle coated with poly(ethylene-co-acrylic acid), wherein the light emitting particle consists of a semiconductor nanocrystal comprising a Group II-VI compound, a Group III-V compound, or a combination thereof, wherein the light emitting particle has a core/shell structure having a first semiconductor nanocrystal being surrounded by a second semiconductor nanocrystal, and the first semiconductor nanocrystal being different from the second semiconductor nanocrystal, wherein the Group II-VI compound comprises
a binary compound selected from CdSe, CdTe, ZnS, ZnSe, ZnTe, HgS, HgSe, HgTe, MgSe, MgS, and a combination thereof, or
a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, or wherein the Group III-V compound comprises
a binary compound selected from GaN, GaP, GaAs, GaSb, AlN, AlP, AlAs, AlSb, InN, InP, InAs, InSb, and a combination thereof, or
a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a combination thereof.

14. A composite comprising a polymerization product of the composition of claim 13.

15. A composition comprising:
a light emitting particle;
a first monomer including at least two thiol groups, each located at a terminal end of the first monomer; and
a second monomer including at least two unsaturated carbon-carbon bonds, each located at a terminal end of the second monomer,
wherein the first monomer is represented by the following Chemical Formula 1:

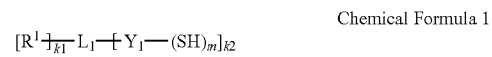

Chemical Formula 1 wherein, in Chemical Formula 1,
R¹ is hydrogen or a C1 to C30 alkyl group;
L₁ is a single bond, a C1 to C30 alkylene group, or a C3 to C30 heteroarylene group;
Y₁ is a single bond; a C1 to C30 alkylene group; or a C1 to C30 alkylene group wherein at least one methylene group is replaced by a carbonyl, an ether, or an ester;
m is an integer of 1 or more;
k1 is an integer of 0 or 1 or more;
k2 is an integer of 1 or more;
the sum of m and k2 is an integer of 3 or more;
m does not exceed the valance of Y₁; and
k1 and k2 does not exceed the valence of the L₁,
wherein the second monomer is represented by the following Chemical Formula 2:

Chemical Formula 2 wherein, in Chemical Formula 2,
X is an acrylate group, a methacrylate group, a C2 to C30 alkenyl group, a C3 to C30 cycloalkyl group substituted with a C2 to C30 alkenyl group, or a combination thereof;
R² is hydrogen, a C1 to C30 alkyl group, or a hydroxyl substituted C1 to C30 alkyl group;
L₂ is a single bond, a C1 to C30 alkylene group, or a C3 to C30 heteroarylene group;
Y₂ is a single bond; a C1 to C30 alkylene group; a C1 to C30 alkylene group wherein at least one methylene group is replaced by a carbonyl, an ether or an ester, or a combination thereof;
n is an integer of 1 or more;
k3 is an integer of 0 or 1 or more;
k4 is an integer of 1 or more;
the sum of n and k4 is an integer of 3 or more;
n does not exceed the valance of Y₂; and
k3 and k4 does not exceed the valence of the L₂, and
wherein the light emitting particle comprises a semiconductor nanocrystal, wherein the semiconductor nanocrystal includes a Group II-VI compound, a Group III-V compound, or a combination thereof,
wherein the light emitting particle has a core/shell structure having a first semiconductor nanocrystal being surrounded by a second semiconductor nanocrystal, and the first semiconductor nanocrystal being different from the second semiconductor nanocrystal,
wherein the Group II-VI compound comprises
a binary compound selected from CdSe, CdTe, ZnS, ZnSe, ZnTe, HgS, HgSe, HgTe, MgSe, MgS, and a combination thereof, or
a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, or
wherein the Group III-V compound comprises
a binary compound selected from GaN, GaP, GaAs, GaSb, AlN, AlP, AlAs, AlSb, InN, InP, InAs, InSb, and a combination thereof, or
a ternary compound selected from GaNP, GaNAs, GaNSb, GaPAs, GaPSb, AlNP, AlNAs, AlNSb, AlPAs, AlPSb, InNP, InZnP, InNAs, InNSb, InPAs, InPSb, and a combination thereof.

16. The composition of claim 15, wherein the second monomer comprises the compounds of the following Chemical Formula 2-6:

Chemical Formula 2-6

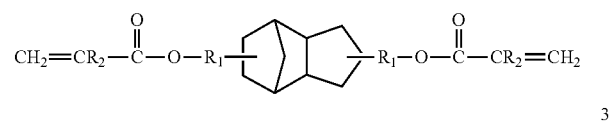

wherein, in Chemical Formula 2-6,
$R_1$ is a C1 to C20 alkylene group, or a substituted C1 to C20 alkylene group wherein at least one methylene group is replaced by —C(=O)—, —O—, —S—, —S(=O)—, —C(=O)O—, —C(=O)NR— wherein R is hydrogen or a C1 to C10 straight or branched alkyl group, or —NR— wherein R is hydrogen or a C1 to C10 alkyl group, and
$R_2$ is hydrogen or a methyl group.

17. A composite comprising a polymerization product of the composition of claim 15.

18. The composition of claim 13, wherein the second monomer of Chemical Formula 2 comprises the compounds of Chemical Formula 2-1 and Chemical Formula 2-2:

Chemical Fomrula 2-1

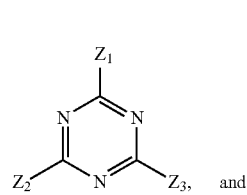

and

Chemical Formula 2-2

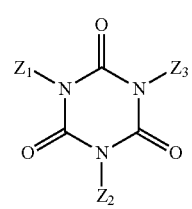

wherein, in Chemical Formulas 2-1 and 2-2, $Z_1$ to $Z_3$ are the same or different, and correspond to —[$Y_2$—$X_n$] of Chemical Formula 2.

19. The composition of claim 13, wherein the second monomer comprises the compounds of the following Chemical Formulas 2-3 to 2-5:

Chemical Formula 2-3

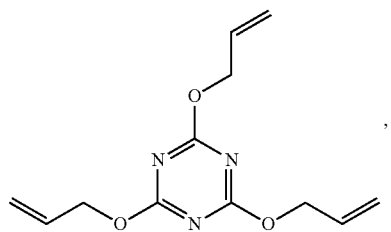

,

Chemical Formula 2-4

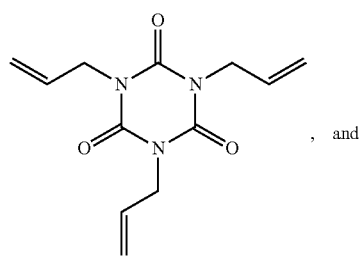

, and

Chemical Formula 2-5

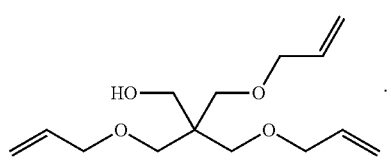

.

20. The composition of claim 13, wherein the first monomer of Chemical Formula 1 comprises the compounds of the following Chemical Formulas 1-2 to 1-5:

Chemical Formula 1-2

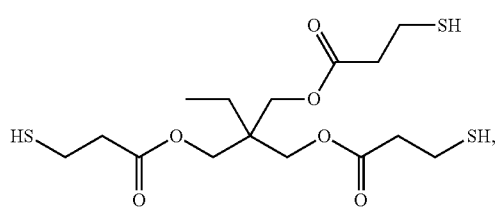

,

Chemical Formula 1-3

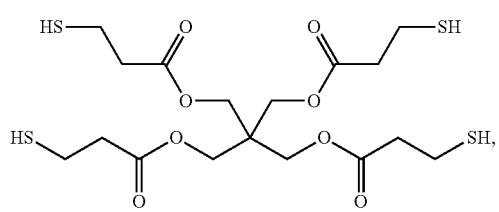

,

-continued

Chemical Formula 1-4

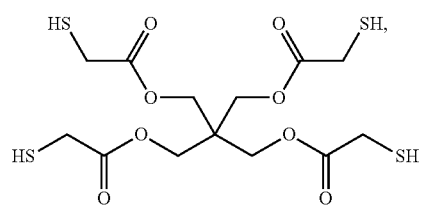

Chemical Formula 1-5

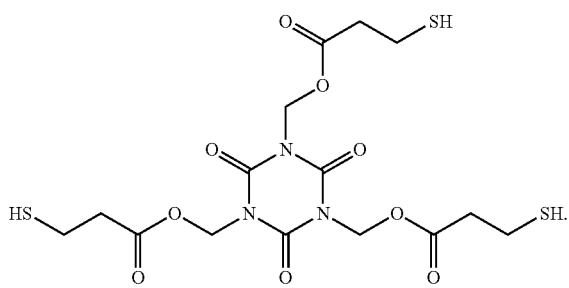

21. The composition of claim 15, wherein the second monomer of Chemical Formula 2 comprises the compounds of Chemical Formula 2-1 and Chemical Formula 2-2:

Chemical Formula 2-1

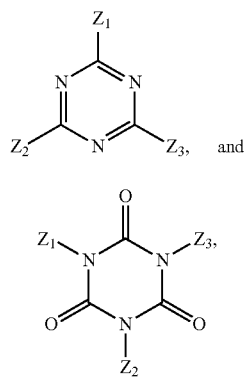

and

Chemical Formula 2-2 wherein, in Chemical Formulas 2-1 and 2-2, $Z_1$ to $Z_3$ are the same or different, and correspond to —$[Y_2—X_n]$ of Chemical Formula 2.

22. The composition of claim 15, wherein the second monomer comprises the compounds of the following Chemical Formulas 2-3 to 2-5:

Chemical Formula 2-3

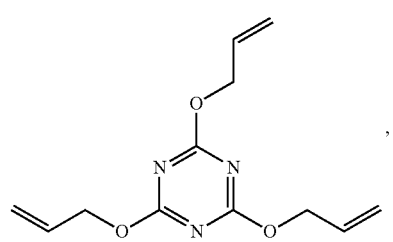

-continued

Chemical Formula 2-4

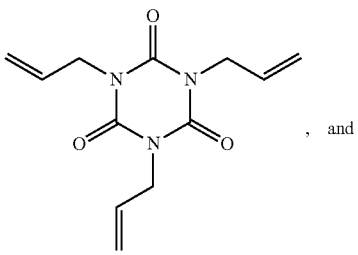

, and

Chemical Formula 2-5

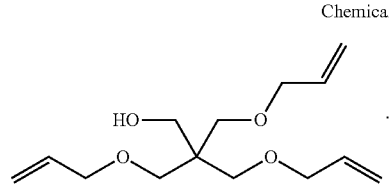

23. The composition of claim 15, wherein the first monomer of Chemical Formula 1 comprises the compounds of Chemical Formulas 1-2 to 1-5:

Chemical Formula 1-2

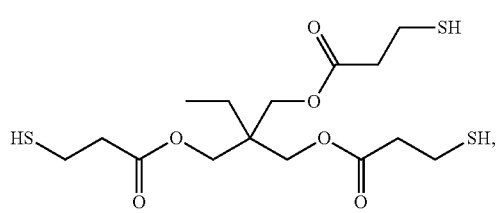

Chemical Formula 1-3

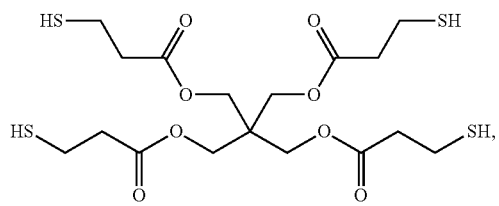

Chemical Formula 1-4

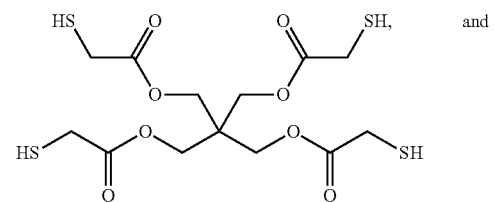

and

Chemical Formula 1-5

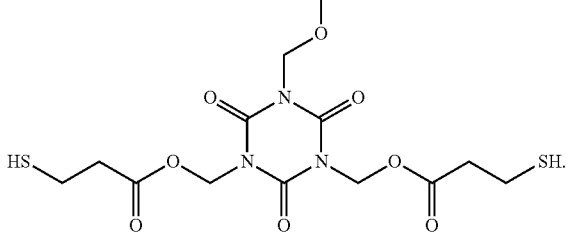

* * * * *